(12) United States Patent
Kanda

(10) Patent No.: US 12,002,794 B2
(45) Date of Patent: Jun. 4, 2024

(54) SEMICONDUCTOR DEVICE

(71) Applicant: ROHM CO., LTD., Kyoto (JP)

(72) Inventor: Takumi Kanda, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 422 days.

(21) Appl. No.: 17/441,950

(22) PCT Filed: Apr. 21, 2020

(86) PCT No.: PCT/JP2020/017201
§ 371 (c)(1),
(2) Date: Sep. 22, 2021

(87) PCT Pub. No.: WO2020/218298
PCT Pub. Date: Oct. 29, 2020

(65) Prior Publication Data
US 2022/0165719 A1 May 26, 2022

(30) Foreign Application Priority Data
Apr. 24, 2019 (JP) .................................. 2019-082614

(51) Int. Cl.
*H01L 25/16* (2023.01)
*H01L 23/00* (2006.01)
(Continued)

(52) U.S. Cl.
CPC .......... *H01L 25/16* (2013.01); *H01L 23/3107* (2013.01); *H01L 23/3735* (2013.01);
(Continued)

(58) Field of Classification Search
CPC ................. H01L 25/072; H01L 23/367; H01L 23/49524; H01L 23/49562;
(Continued)

(56) References Cited

U.S. PATENT DOCUMENTS

2014/0284781 A1 9/2014 Asaoka
2017/0229953 A1* 8/2017 Otake ................. H01L 23/5386

FOREIGN PATENT DOCUMENTS

JP 2001-144248 A 5/2001
JP 2004-152861 A 5/2004
(Continued)

OTHER PUBLICATIONS

Office Action received in the corresponding Japanese Patent application, Aug. 1, 2023, and machine translation (10 pages).
(Continued)

*Primary Examiner* — Robert G Bachner
(74) *Attorney, Agent, or Firm* — HSML P.C.

(57) ABSTRACT

A semiconductor device includes a support member, a first switching element, a second switching element, a first passive element, a second passive element, and an electrical conductor. The support member includes a plurality of wiring parts, and the plurality of wiring parts include a first wiring section and a second wiring section spaced apart from each other in a first direction perpendicular to the thickness direction of the support member. The first switching element is electrically connected to the first wiring section. The second switching element is electrically connected to the first switching element and the second wiring section. The first passive element has a first electrode and a second electrode, and the first electrode is bonded to the first wiring section. The second passive element has a third electrode and a fourth electrode, and the fourth electrode is bonded to the second wiring section. The electrical conductor connects the second electrode and the third electrode to each other. At least one of the first passive element and the second passive element is a capacitor.

17 Claims, 22 Drawing Sheets

(51) Int. Cl.
*H01L 23/31* (2006.01)
*H01L 23/373* (2006.01)
*H01L 25/07* (2006.01)
*H01L 25/18* (2023.01)

(52) U.S. Cl.
CPC .............. *H01L 24/32* (2013.01); *H01L 24/48* (2013.01); *H01L 24/73* (2013.01); *H01L 25/072* (2013.01); *H01L 25/18* (2013.01); *H01L 2224/32225* (2013.01); *H01L 2224/48175* (2013.01); *H01L 2224/48225* (2013.01); *H01L 2224/73265* (2013.01); *H01L 2924/10272* (2013.01); *H01L 2924/12032* (2013.01); *H01L 2924/1205* (2013.01); *H01L 2924/1207* (2013.01); *H01L 2924/13091* (2013.01)

(58) Field of Classification Search
CPC .............. H01L 23/49894; H01L 25/18; H01L 2224/40137; H01L 23/36; H01L 23/49575
See application file for complete search history.

(56) References Cited

FOREIGN PATENT DOCUMENTS

| JP | 2005-251839 A | 9/2005 |
|----|---------------|--------|
| JP | 2009-225612 A | 10/2009 |
| JP | 2010-205960 A | 9/2010 |
| JP | 2013-187464 A | 9/2013 |
| JP | 2013-252009 A | 12/2013 |
| JP | 2020-4929 A | 1/2020 |
| WO | 2016/067835 A1 | 5/2016 |

OTHER PUBLICATIONS

International Search Report issued in PCT/JP2020/017201, Jul. 28, 2020 (3 pages).
Office Action received in the corresponding Chinese Patent application, May 17, 2023, and machine translation (15 pages).
Office Action received in the corresponding Chinese Patent application, Nov. 23, 2023, and machine translation (13 pages).

* cited by examiner

SEMICONDUCTOR DEVICE

TECHNICAL FIELD

The present disclosure relates to a semiconductor device including a plurality of switching elements.

BACKGROUND ART

Conventionally, semiconductor devices with a plurality of switching elements (e.g. MOSFET, IGBT etc.) are widely known. Patent Document 1 discloses an example of such a semiconductor device. Generally, driving the switching elements causes generation of a surge voltage in the semiconductor device. The surge voltage tends to increase as a larger current flows through the switching elements or the switching elements are driven at a higher speed. An excessively large surge voltage may destroy the switching elements.

The semiconductor device disclosed in the Patent Document 1 has a plurality of snubber terminals, which are connected to a plurality of snubber circuits for reducing the surge voltage. However, the snubber circuits are formed on a circuit board on which the semiconductor device is mounted. This leads to an increase in size of the circuit board, which leaves room for improvement.

TECHNICAL REFERENCE

Patent Document

Patent Document 1: JP-A-2004-152861

SUMMARY OF THE INVENTION

Problems to be Solved by the Invention

Under the above circumstances, an object of the present disclosure is to provide a technique that allows for avoiding an increase in size of a circuit board on which the semiconductor device is mounted while reducing the surge voltage generated in the semiconductor device.

Means for Solving the Problems

A semiconductor device provided according to a first aspect of the present disclosure includes: a support member provided with a plurality of wiring parts including a first wiring section and a second wiring section spaced apart from each other in a first direction perpendicular to a thickness direction; a first switching element electrically connected to the first wiring section; a second switching element electrically connected to the first switching element and the second wiring section; a first passive element having a first electrode and a second electrode, the first electrode being bonded to the first wiring section; a second passive element having a third electrode and a fourth electrode, the fourth electrode being bonded to the second wiring section; and an electrical conductor connecting the second electrode and the third electrode, wherein at least one of the first passive element and the second passive element is a capacitor.

Preferably, both the first passive element and the second passive element are capacitors.

Preferably, either the first passive element or the second passive element is a resistor.

Preferably, the first electrode and the second electrode are spaced apart from each other in the thickness direction, the third electrode and the fourth electrode are spaced apart from each other in the thickness direction, and the first passive element and the second passive element are spaced apart from each other in the first direction.

Preferably, the electrical conductor is spaced apart from the plurality of wiring parts in the thickness direction and supported by the first passive element and the second passive element.

Preferably, the first electrode and the second electrode are spaced apart from each other in the first direction, the third electrode and the fourth electrode are spaced apart from each other in the first direction, and the electrical conductor, the second electrode, and the third electrode are located between the first wiring section and the second wiring section as viewed along the thickness direction.

Preferably, the Young's modulus of the electrical conductor is smaller than that of the first wiring section and that of the second wiring section.

Preferably, the semiconductor device further includes an electrical insulator that is thermally conductive and located between the first passive element and the second passive element, and the electrical insulator is in contact with the electrical conductor and at least one of the first wiring section and the second wiring section.

Preferably, the semiconductor device further includes an electrical insulator that is thermally conductive and located between the first wiring section and the second wiring section, and the electrical insulator is in contact with the electrical conductor and at least one of the first wiring section and the second wiring section.

Preferably, the support member includes an insulating substrate to which the plurality of wiring parts are fixed, and the electrical insulator is in contact with the insulating substrate.

Preferably, the semiconductor device further includes a sealing resin. The sealing resin covers the insulating substrate, the plurality of wiring parts, the first switching element, the second switching element, the first passive element, the second passive element and the electrical conductor. The support member is located opposite to the plurality of wiring parts with respect to the insulating substrate in the thickness direction and includes a heat dissipator fixed to the insulating substrate. The heat dissipator is exposed from the sealing resin. As viewed along the thickness direction, the heat dissipator overlaps with the plurality of wiring parts and located inward of a peripheral edge of the insulating substrate.

Preferably, the plurality of wiring parts include a third wiring section. The third wiring section is spaced apart from the first wiring section and the second wiring section in a second direction perpendicular to both the thickness direction and the first direction. The second switching element is bonded to the third wiring section. The first switching element is bonded to the first wiring section and electrically connected to the third wiring section.

Preferably, the semiconductor device further includes a first diode and a second diode. The first diode is connected in parallel with the first switching element to the first wiring section. The second diode is connected in parallel with the second switching element to the second wiring section.

A semiconductor device provided according to a second aspect of the present disclosure includes: a support member that includes a plurality of wiring parts including a first wiring section and a second wiring section spaced apart from each other in a first direction perpendicular to a thickness direction; a first switching element electrically connected to the first wiring section; a second switching element electrically connected to the first switching element and the second wiring section; and a snubber capacitor located between the first wiring section and the second wiring section. The snubber capacitor has a first conducting portion and a second conducting portion spaced apart from each other, and an insulating portion including a portion sandwiched between the first conducting portion and the second conducting portion. The first conducting portion is connected to the first wiring section and extends from the first wiring section in the first direction. The second conducting portion is connected to the second wiring section and extends from the second wiring section in the first direction.

Preferably, the support member includes an insulating substrate to which the plurality of wiring parts are fixed. The insulating portion is thermally conductive and in contact with the insulating substrate.

Preferably, the first conducting portion and the second conducting portion are spaced apart from each other in a second direction perpendicular to both the thickness direction and the first direction.

Preferably, the first conducting portion and the second conducting portion are spaced apart from each other in the thickness direction.

Preferably, the semiconductor device further includes a sealing resin. The sealing resin covers the insulating substrate, the plurality of wiring parts, the first switching element, the second switching element and the snubber capacitor. The support member is located opposite to the plurality of wiring parts the with respect to the insulating substrate in the thickness direction and includes a heat dissipator fixed to the insulating substrate. The heat dissipator is exposed from the sealing resin. As viewed along the thickness direction, the heat dissipator overlaps with the plurality of wiring parts and located inward of the peripheral edge of the insulating substrate.

The above semiconductor device allows for avoiding an increase in size of a circuit board on which the semiconductor device is mounted while reducing the surge voltage generated in the semiconductor device.

Other features and advantages of the present disclosure will become more apparent from the detailed description given below with reference to the accompanying drawings.

MODE FOR CARRYING OUT THE INVENTION

Various embodiments of the present disclosure are described below based on the accompanying drawings.

Figure 2:
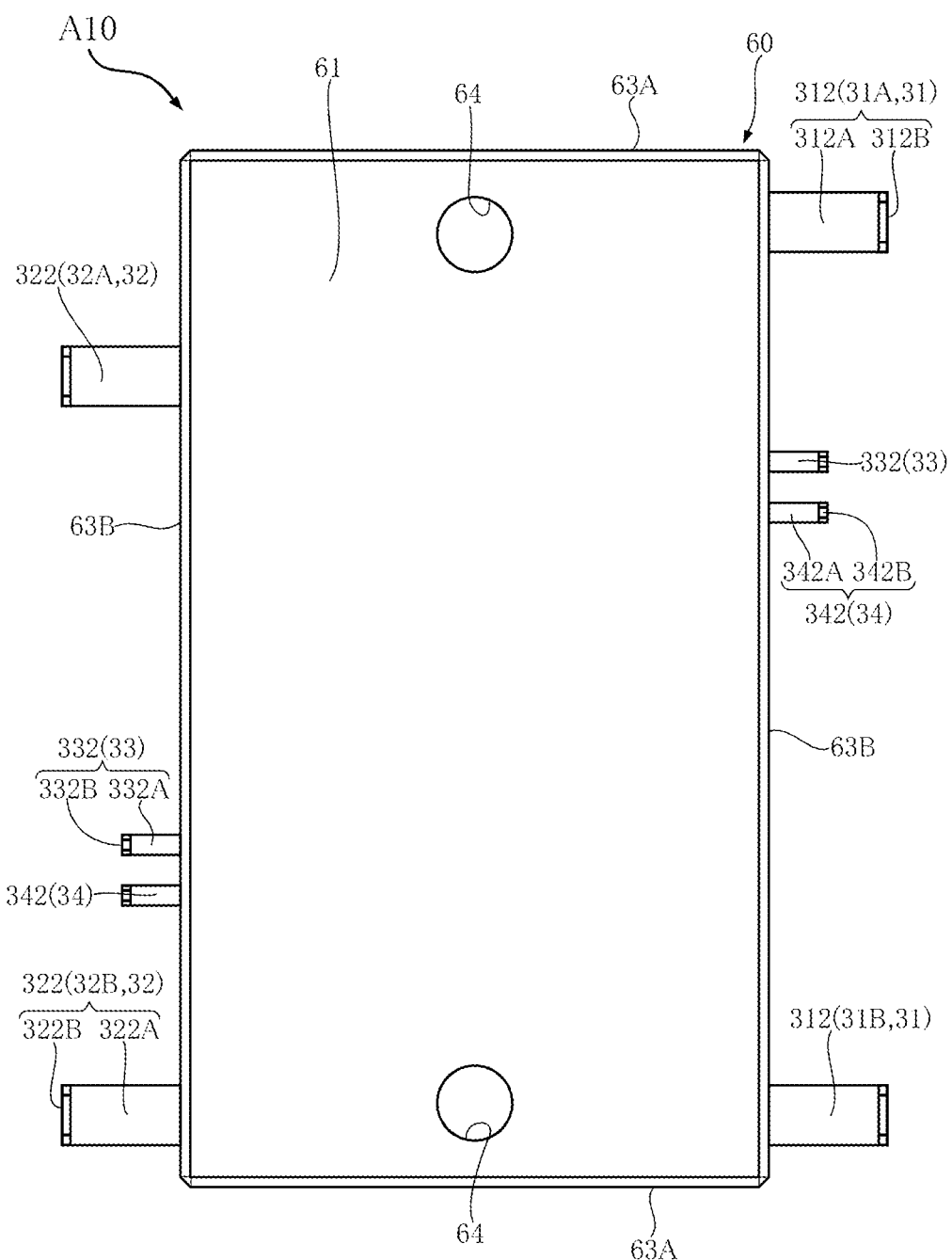
FIG. 2 is a plan view of the semiconductor device shown in FIG. 1.
Figure 3:
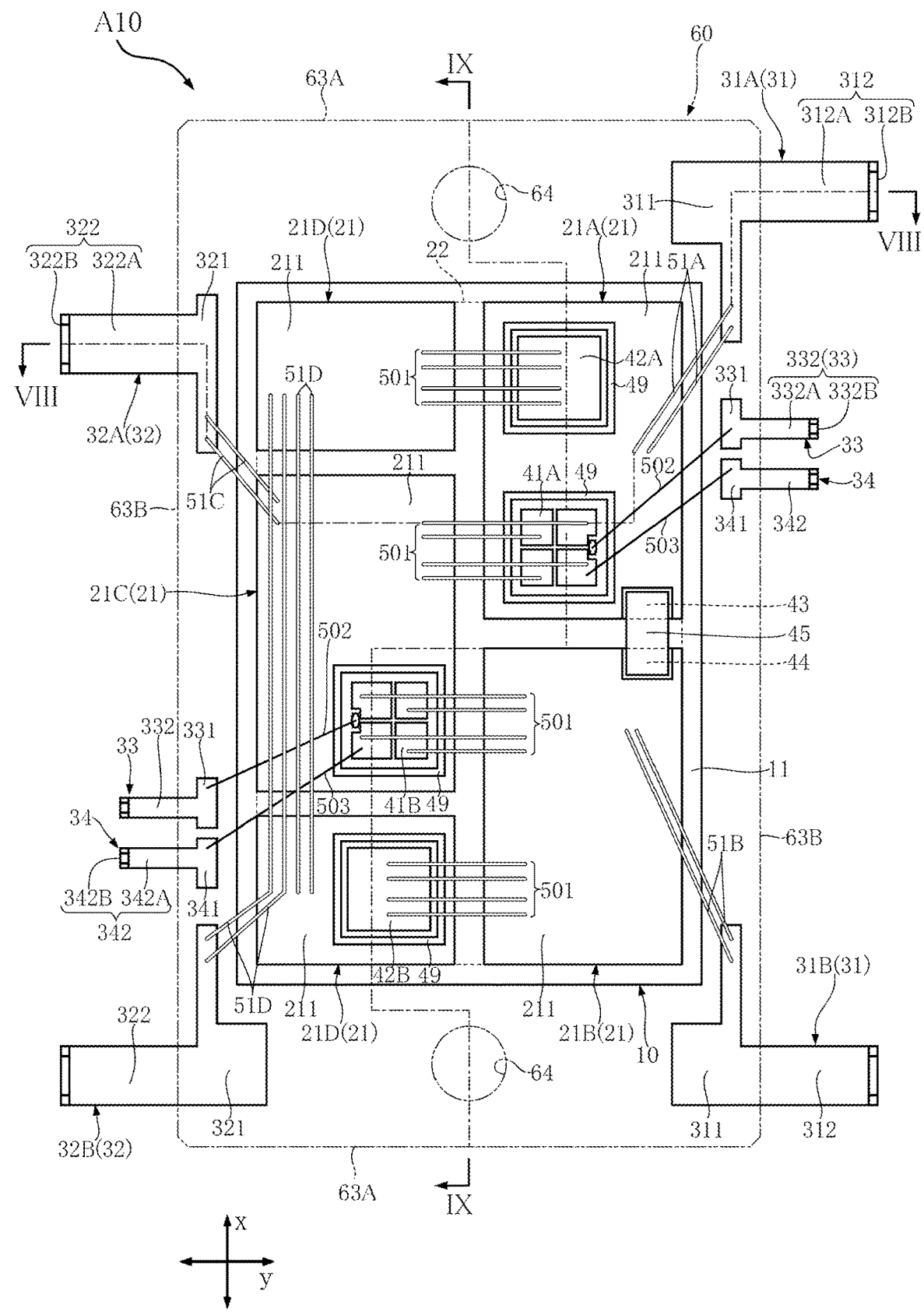
FIG. 3 is a plan view of the semiconductor device shown in FIG. 1 (as seen through the sealing resin)

A semiconductor device A10 according to a first embodiment is described below with reference to FIGS. 1-15. The semiconductor device A10 includes a support member 10, a first switching element 41A, a second switching element 41B, a first diode 42A, a second diode 42B, a first passive element 43, a second passive element 44, an electrical conductor 45 and a sealing resin 60 (see FIGS. 3, 8, 9 and 11-13, for example). In addition to these, as shown in FIG. 3 (and FIG. 1), the semiconductor device A10 includes a pair of input terminals 31, a pair of output terminals 32, a pair of gate terminals 33, a pair of detection terminals 34, a plurality of first conduction members 51A, a plurality of second conduction members 51B, a plurality of third conduction members 51C, and a plurality of fourth conduction members 51D. In the semiconductor device A10, DC power is converted into AC power by driving the first switching element 41A and the second switching element 41B. The semiconductor device A10 is used for a driving source of a motor, an inverter device for various electric appliances, and a DC/DC converter, for example. In FIG. 3, the sealing resin 60 is illustrated as transparent (see two-dot chain line) for convenience of understanding.

Figure 9:
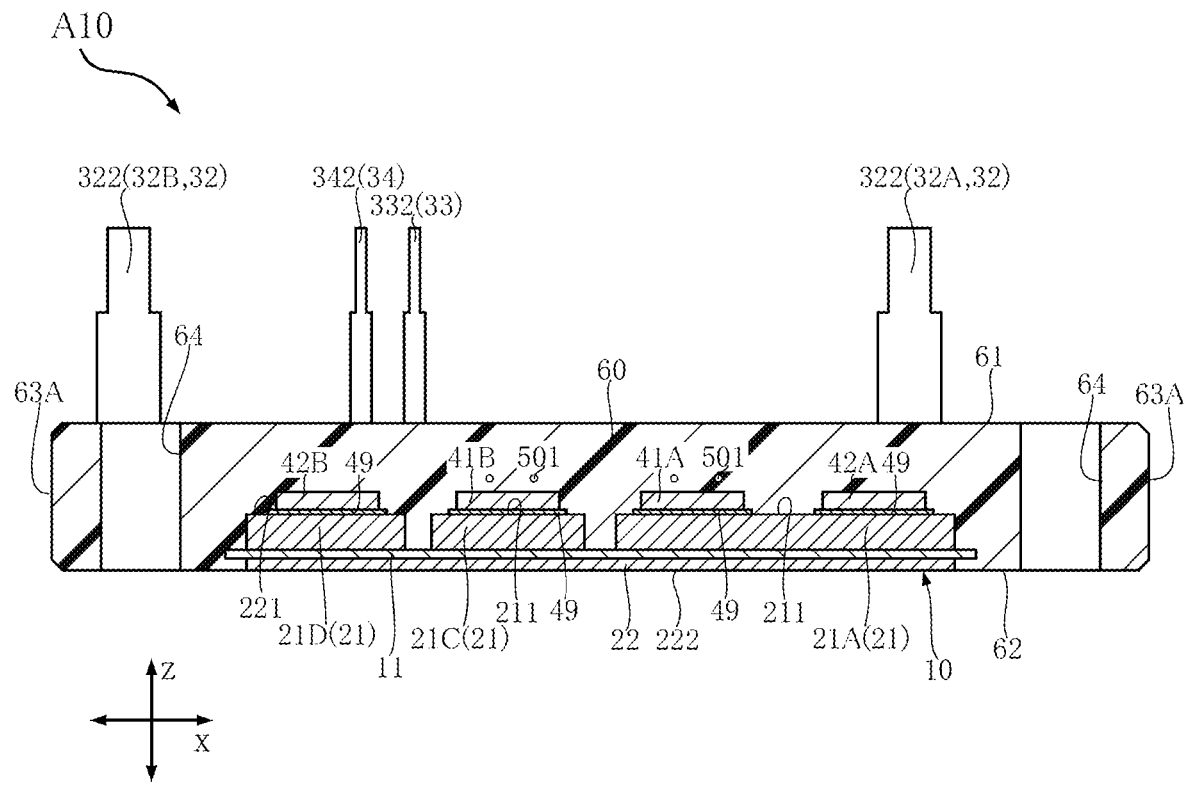
FIG. 9 is a sectional view taken along line IX-IX in FIG. 3.

As shown in FIGS. 3 and 9, the support member 10 supports the first switching element 41A, the second switching element 41B, the first diode 42A and the second diode 42B. The support member 10 constitutes a part of the conduction path between the plurality of semiconductor elements (41A, 41B, 42A, 42B) and a circuit board on which the semiconductor device A10 is mounted. In the example shown in the figure, the support member 10 includes an insulating substrate 11, a plurality of wiring parts 21 and a heat dissipator 22. Instead of this, the support member 10 may consist of a lead frame alone.

Figure 1:
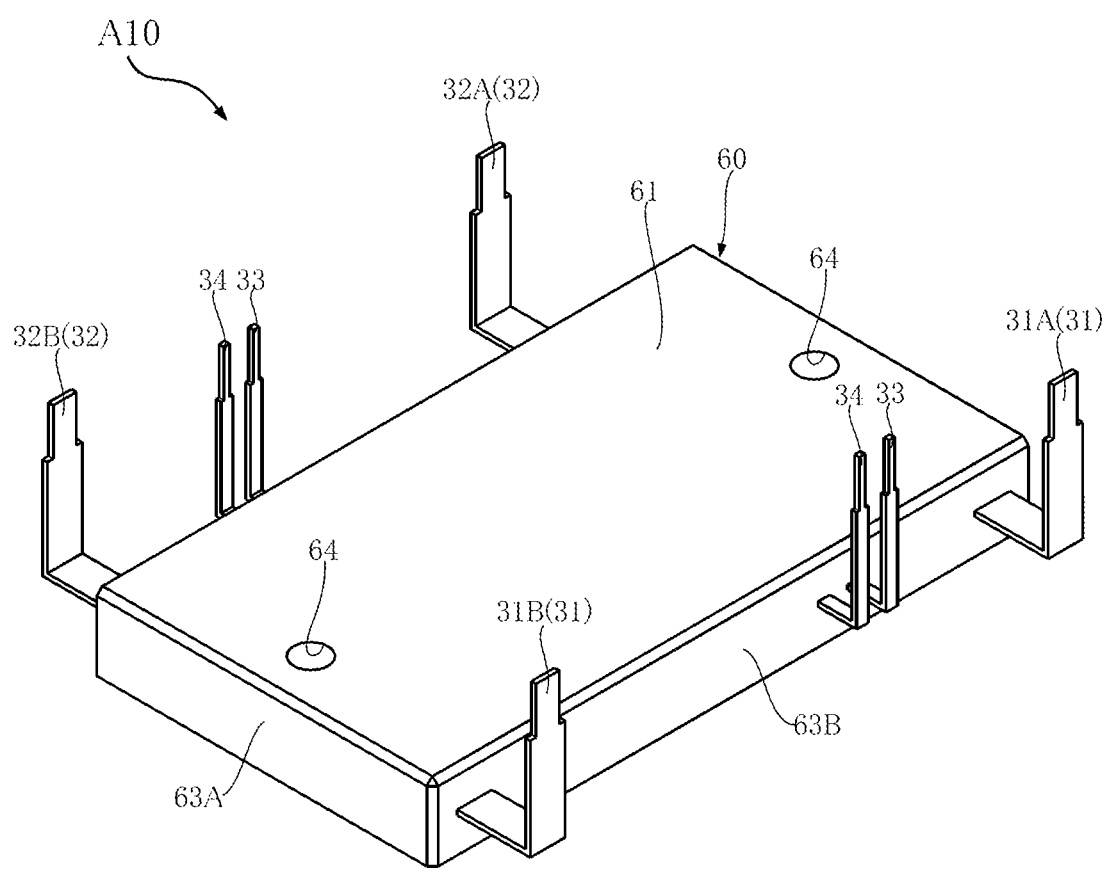
FIG. 1 is a perspective view of a semiconductor device according to a first embodiment.

In the description of the semiconductor device A10, the thickness direction of the support member 10 (more specifically, the thickness direction of any one of the wiring parts 21) is referred to as "thickness direction z" (or "direction z" or "thickness direction"). One direction perpendicular to the thickness direction z is referred to as "first direction x" (or "direction x" or "first direction"). The direction perpendicular to both the thickness direction z and the first direction x is referred to as "second direction y" (or "direction y" or "second direction"). As shown in FIGS. 1 and 2, the semiconductor device A10 is rectangular as viewed along the thickness direction z (i.e., as viewed in plan). In the illustrated example, the semiconductor device A10 is relatively long in the first direction x and relatively short in the second direction y, but the present disclosure is not limited to this.

Figure 8:
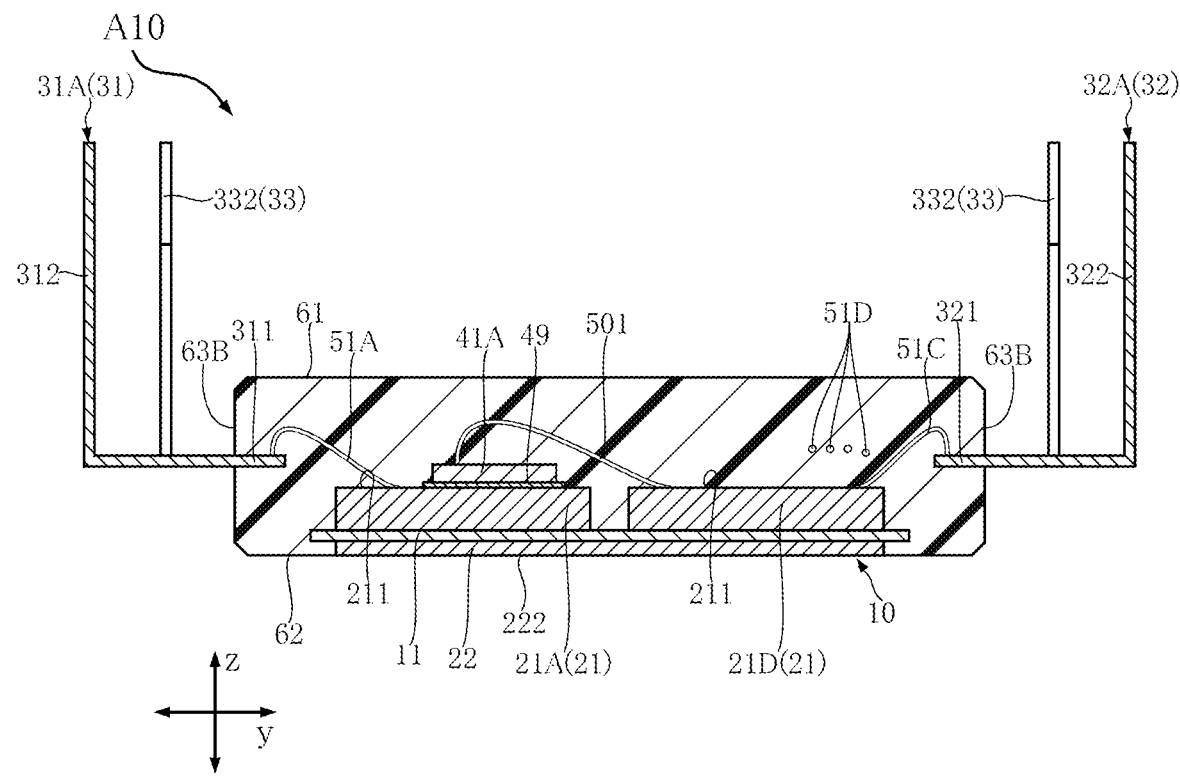
FIG. 8 is a sectional view taken along line VIII-VIII in FIG. 3.

As shown in FIGS. 8 and 9, the wiring parts 21 and the heat dissipator 22 are fixed to the insulating substrate 11. Preferably, the insulating substrate 11 is made of a material having a relatively high thermal conductivity. The insulating substrate 11 is made of a ceramic material containing, for example, silicon nitride ($Si_3N_4$) or aluminum nitride (AlN). The insulating substrate 11 has a first surface (the upper surface in FIG. 8) and a second surface (the lower surface in FIG. 8) spaced apart from each other in the thickness direction z.

As shown in FIGS. 8 and 9, the wiring parts 21 are fixed to the upper surface (the surface on one side in the thickness direction z) of the insulating substrate 11. The wiring parts 21, along with the paired input terminals 31 and the paired output terminals 32 (see FIG. 3), form a conduction path between the semiconductor elements, such as the first switching element 41A and the first diode 42A, and the circuit board on which the semiconductor device A10 is mounted. The wiring parts 21 are metal layers made of copper (Cu), for example. The thickness t of each wiring part 21 (see FIGS. 11 and 13) is larger than the thickness t0 of the insulating substrate 11. The thickness t is 0.8 mm or more, for example. Each wiring part 21 has a obverse surface 211. The obverse surfaces 211 face toward the semiconductor elements, such as the first switching element 41A and the first diode 42A, in the thickness direction z. The obverse surface 211 of each wiring part 21 may be plated with a plurality of types of metal so as to form a silver (Ag) plating layer or an aluminum (Al) layer, a nickel (Na) layer, and a silver layer in the mentioned order. As shown in FIG. 3, as viewed along the thickness direction z, all of the wiring parts 21 are located inward of the peripheral edge of the insulating substrate 11.

As shown in FIG. 3, in the semiconductor device A10, the plurality of wiring parts 21 include a first wiring section 21A, a second wiring section 21B, a third wiring section 21C and a pair of fourth wiring sections 21D.

As shown in FIG. 3, the first wiring section 21A and the second wiring section 21B are spaced apart from each other in the first direction x. As viewed along the thickness direction z, each of the first wiring section 21A and the second wiring section 21B has a rectangular shape with the long side in the first direction x. In the second direction y, the third wiring section 21C is located between the first and the second wiring sections 21A, 21B and the paired output terminals 32. The third wiring section 21C is spaced apart from the first and the second wiring sections 21A and 21B in the second direction y. As viewed along the thickness direction z, the third wiring section 21C has a rectangular shape with the long side in the first direction x. The paired fourth wiring sections 21D are located on each side of the third wiring section 21C in the first direction x. The paired fourth wiring sections 21D are spaced apart from the first and the second wiring sections 21A and 21B in the second direction y. The paired fourth wiring sections 21D and the third wiring section 21C are spaced apart from each other in the first direction x.

Figure 4:
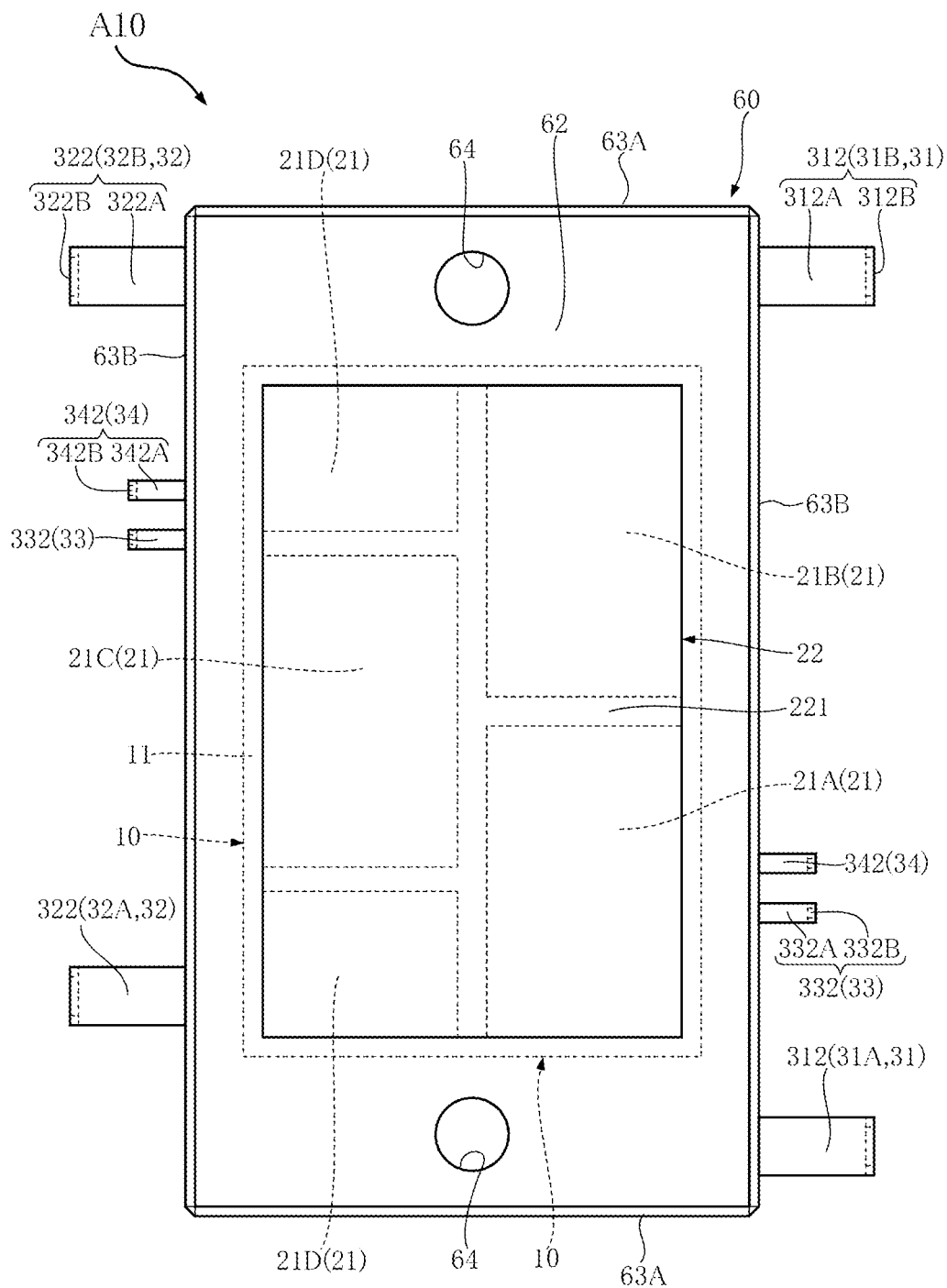
FIG. 4 is a bottom view of the semiconductor device shown in FIG. 1.

As shown in FIGS. 8 and 9, the heat dissipator 22 is located opposite to the wiring parts 21 with respect to the insulating substrate 11 in the thickness direction z and fixed to the insulating substrate 11. The heat dissipator 22 is a metal layer made of (or containing) copper, for example. As shown in FIG. 4, the heat dissipator 22 overlaps with the plurality of wiring parts 21, as viewed along the thickness direction z. As viewed along the thickness direction z, the heat dissipator 22 is located inward of the peripheral edge of the insulating substrate 11. The heat dissipator 22 has a reverse surface 221. The reverse surface 221 faces away from the obverse surfaces 211 of the wiring parts 21.

Figure 14:
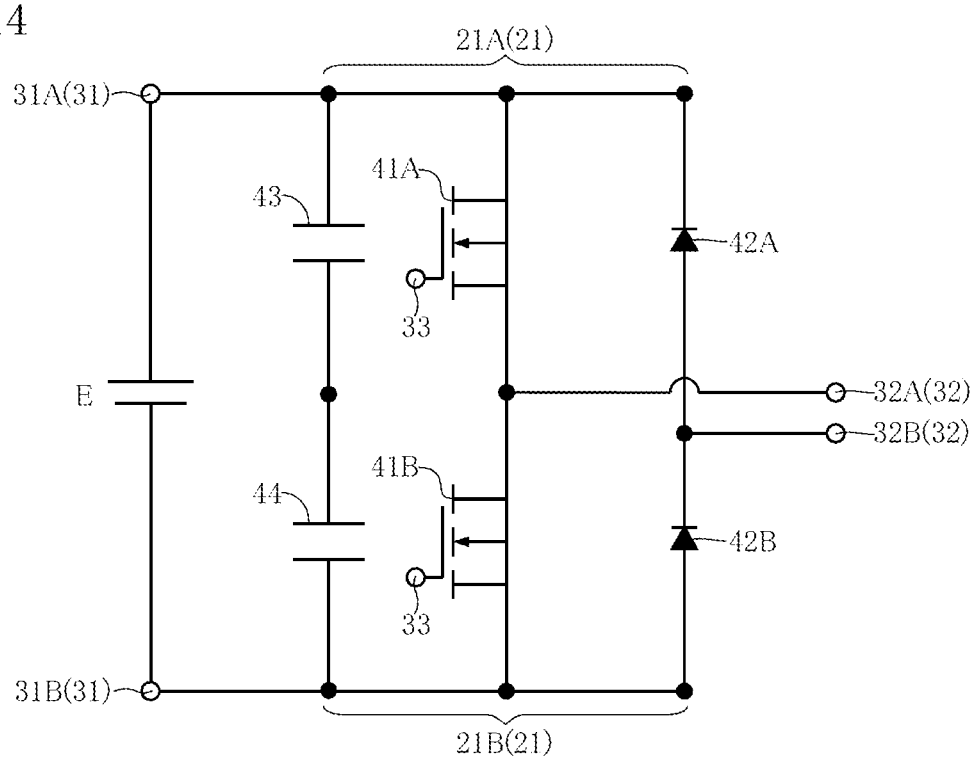
FIG. 14 is a circuit diagram of the semiconductor device shown in FIG. 1 (where both the first passive element and the second passive element are capacitors)
Figure 15:
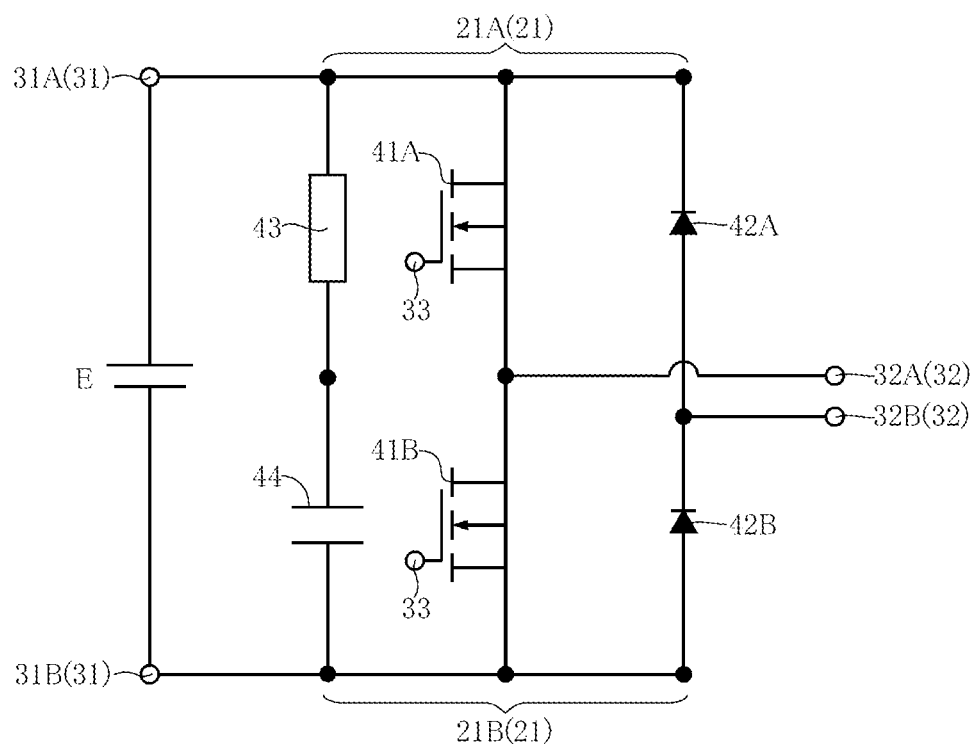
FIG. 15 is a circuit diagram of the semiconductor device shown in FIG. 1 (where the first passive element is a resistor, and the second passive element is a capacitor)

As shown in FIG. 3, the paired input terminals 31 are located on one side of the wiring parts 21 in the second direction y. The paired input terminals 31 are spaced apart from the support member 10. The input terminals 31 are spaced apart from each other in the first direction x. Direct current power is input to the paired input terminals 31 for conversion by the semiconductor device A10. Thus, as shown in FIGS. 14 and 15, when the semiconductor device A10 is mounted on a circuit board, the paired input terminals 31 are connected to a DC power supply E. In the illustrated example of the semiconductor device A10, the paired input terminals 31, along with a pair of output terminals 32, a pair of gate terminals 33 and a pair of detection terminals 34, are made of a same lead frame. The lead frame is made of copper or copper alloy, for example. The paired input terminals 31 include a first input terminal 31A and a second input terminal 31B. Of the paired input terminals 31, the first input terminal 31A is closer to first wiring section 21A. The first input terminal 31A forms the positive electrode (P terminal) of the pair of the input terminals 31. Of the paired input terminals 31, the second input terminal 31B is closer to the second wiring section 21B. The second input terminal 31B forms the negative electrode (N terminal) of the pair of the input terminals 31. Each of the first input terminal 31A and the second input terminal 31B has a pad portion 311 and a terminal portion 312.

As shown in FIGS. 3 and 8, the pad portions 311 are spaced apart from the support member 10 and covered with the sealing resin 60. Thus, the paired input terminals 31 are supported by the sealing resin 60. The surfaces of the pad portions 311 may be plated with silver.

Figure 5:
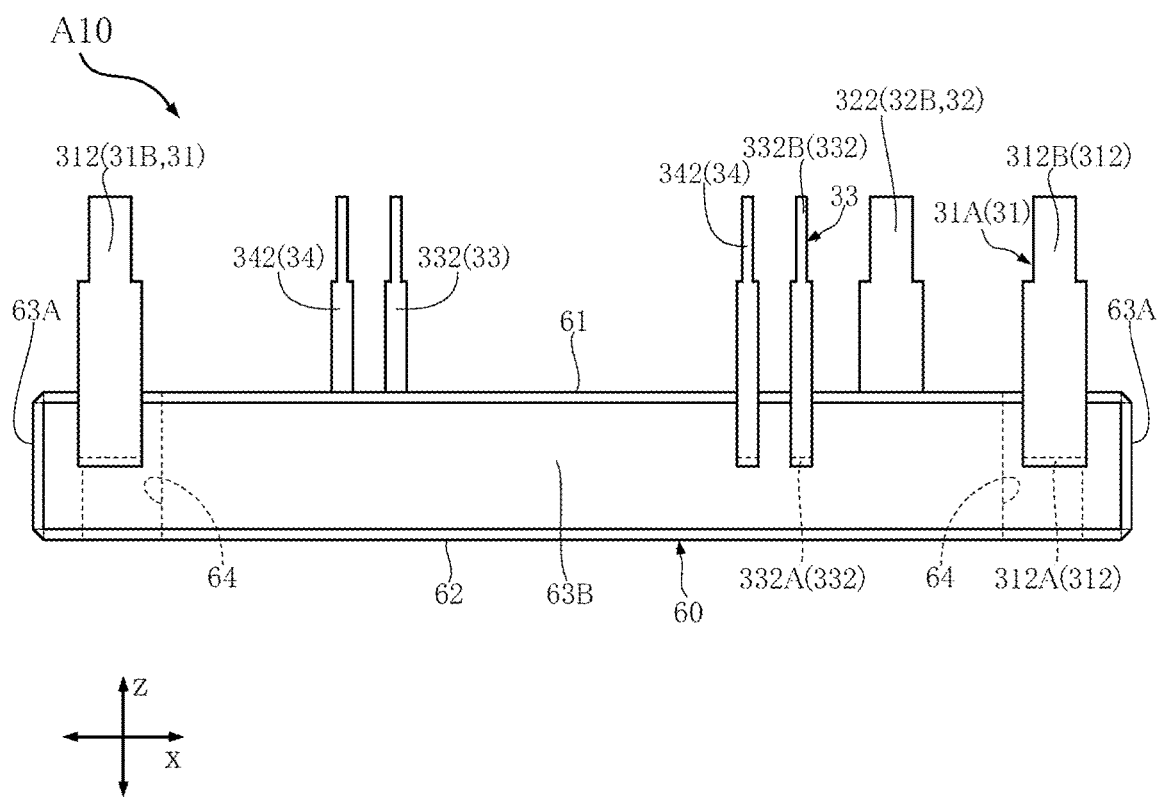
FIG. 5 is a right side view of the semiconductor device shown in FIG. 1.
Figure 7:
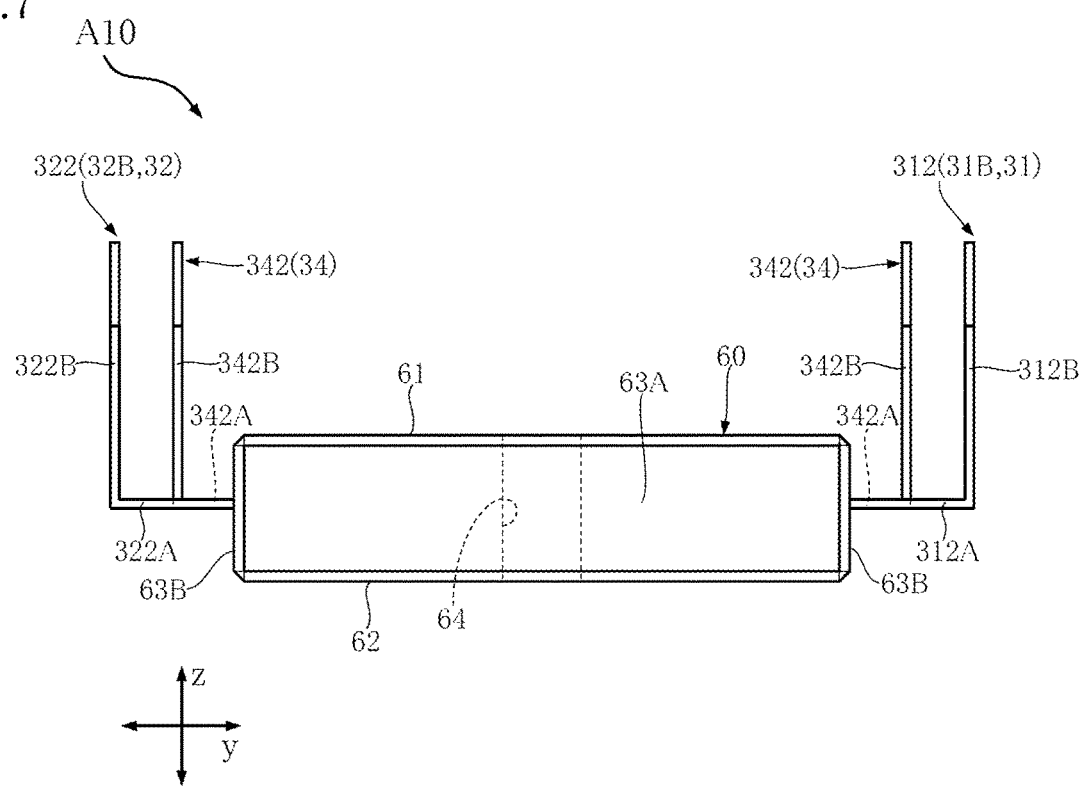
FIG. 7 is a front view of the semiconductor device shown in FIG. 1.

As shown in FIGS. 3 and 8, the terminal portions 312 are connected to the pad portions 311 and exposed from the sealing resin 60. The terminal portions 312 are used in mounting the semiconductor device A10 to a circuit board. Each terminal portion 312 has a base part 312A and a standing part 312B. The base parts 312A are connected to the pad portions 311 and extend out from the sealing resin 60 in the second direction y. As shown in FIGS. 5, 7 and 8, each standing part 312B extends from the end of a base part 312A in the second direction y toward the side which the obverse surfaces 211 of the wiring parts 21 face in the thickness direction z. Thus, as viewed along the first direction x, each terminal portion 312 is L-shaped. The surfaces of the terminal portions 312 may be plated with nickel, for example.

As shown in FIG. 3, the paired output terminals 32 are located opposite to the paired input terminals 31 with respect to the wiring parts 21 in the second direction y. The paired output terminals 32 are spaced apart from the support member 10. The output terminals 32 are spaced apart from each other in the first direction x. Alternating current power converted by the semiconductor device A10 is output from the paired output terminals 32. When the semiconductor device A10 is mounted, the paired output terminals 32 are electrically connected, via a single wiring member, to the positive electrode of a load such as a motor. The paired output terminals 32 include a first output terminal 32A and a second output terminal 32B. Of the paired output terminals 32, the first output terminal 32A is closer to the first input terminal 31A. Through the first output terminal 32A, current flows from the semiconductor device A10 to the load. Of the paired output terminals 32, the second output terminal 32B is closer to the second input terminal 31B. Through the second output terminal 32B, current flows from the load to the semiconductor device A10. Each of the first output terminal 32A and the second output terminal 32B has a pad portion 321 and a terminal portion 322.

As shown in FIGS. 3 and 8, the pad portions 321 are spaced apart from support member 10 and covered with the sealing resin 60. Thus, the paired output terminals 32 are supported by the sealing resin 60. The surfaces of the pad portions 321 may be plated with silver.

Figure 6:
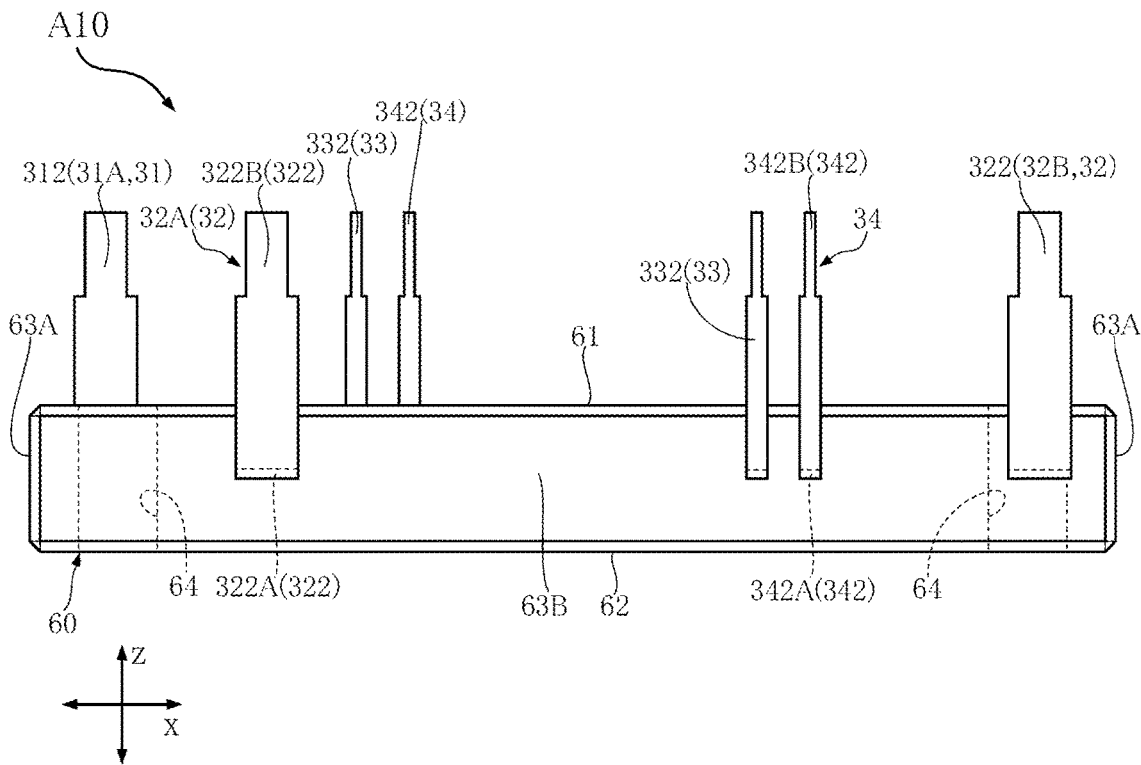
FIG. 6 is a left side view of the semiconductor device shown in FIG. 1.

As shown in FIGS. 3 and 8, the terminal portions 322 are connected to the pad portions 321 and exposed from the sealing resin 60. The terminal portions 322 are used in mounting the semiconductor device A10 to a circuit board. Each terminal portion 322 includes a base part 322A and a standing part 322B. The base parts 322A are connected to the pad portions 321 and extend out from the sealing resin 60 in the second direction y. As shown in FIGS. 6-8, each standing part 322B extends from the end of a base part 322A in the second direction y toward the side which the obverse surfaces 211 of the wiring parts 21 face in the thickness direction z. Thus, as viewed along the first direction x, each terminal portion 322 is L-shaped. The shape of the terminal portions 322 is the same as that of the terminal portions 312 of the paired input terminals 31. The surfaces of the terminal portions 322 may be plated with nickel, for example.

As shown in FIGS. 3 and 9, each of the first switching element 41A and the second switching element 41B is bonded to the obverse surface 211 of one of the wiring parts 21. As viewed along the thickness direction z, both the first switching element 41A and the second switching element 41B are rectangular (square in the semiconductor device A10). In the example of the semiconductor device A10, both the first switching element 41A and the second switching element 41B are MOSFETs (Metal-Oxide-Semiconductor Field-Effect Transistor) containing silicon carbide (SiC) as the main semiconductor material. The first switching element 41A and the second switching element 41B are not limited to MOSFETs, and may be a switching element such as a field effect transistor including a MISFET (Metal-Insulator-Semiconductor Field-Effect Transistor) or a bipolar transistor such as an IGBT (Insulated Gate Bipolar Transistor). In the illustrated semiconductor device A10, both the first switching element 41A and the second switching element 41B are n-channel vertical MOSFETs.

Figure 10:
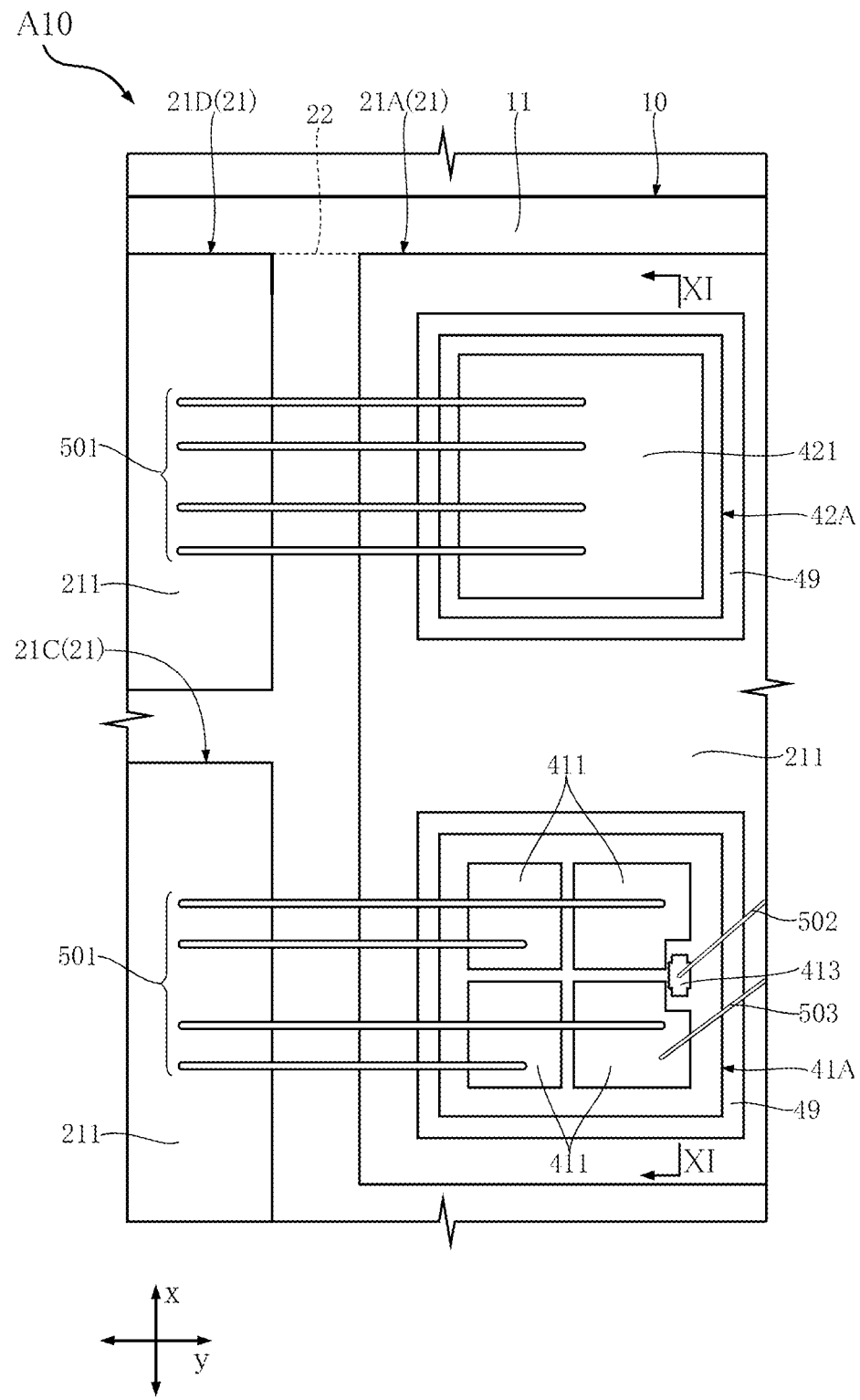
FIG. 10 is a partial enlarged view of FIG. 3.
Figure 11:
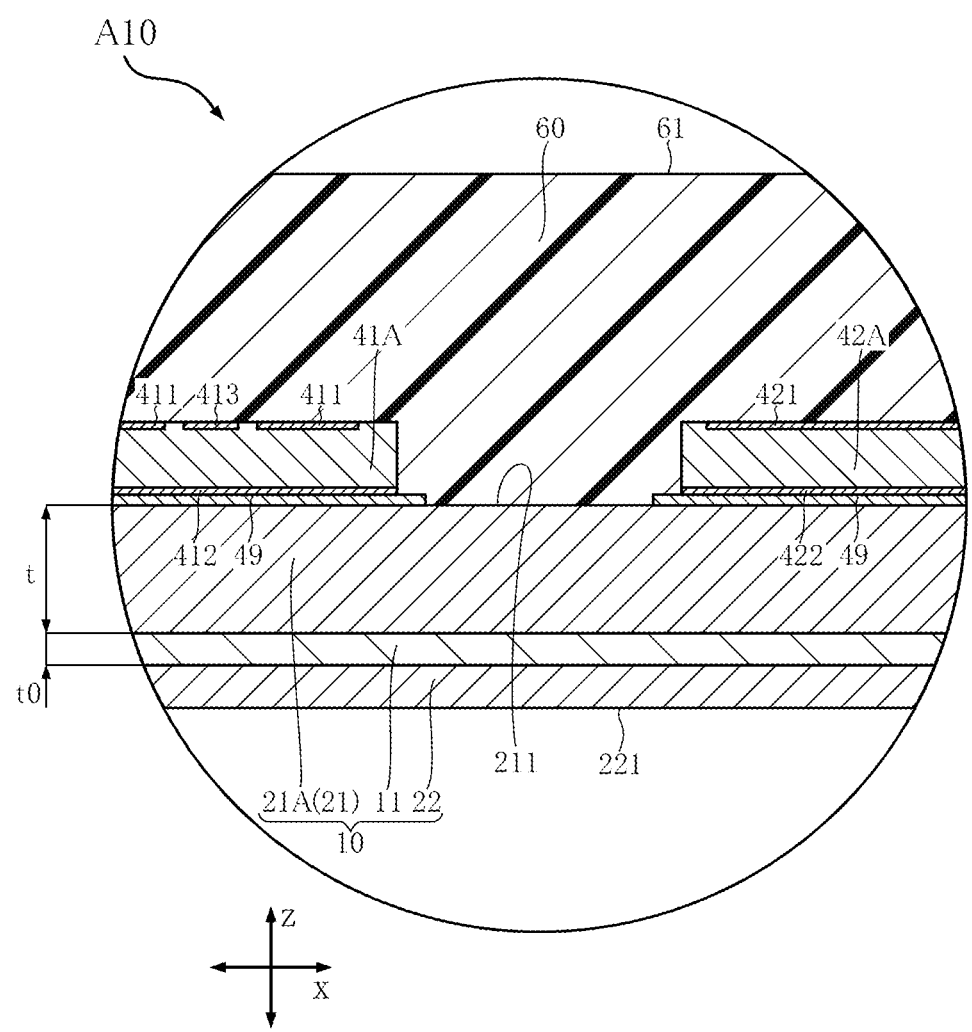
FIG. 11 is a sectional view taken along line XI-XI in FIG. 10.

As shown in FIGS. 10 and 11, each of the first switching element 41A and the second switching element 41B has a obverse surface electrode 411, a reverse surface electrode 412 and a gate electrode 413.

As shown in FIG. 11, the obverse surface electrodes 411 are located farther from the obverse surfaces 211 of the wiring parts 21 in the thickness direction z. In each of the first switching element 41A and the second switching element 41B, source current flows from inside the switching element to the obverse surface electrode 411. As shown in FIG. 10, in the semiconductor device A10, each obverse surface electrode 411 is divided into four portions. Wires 501 are individually bonded to the four portions of the obverse surface electrode 411. The wires 501 are made of a metal including aluminum, for example. The wires 501 bonded to the obverse surface electrode 411 of the first switching element 41A are bonded to the obverse surface 211 of the third wiring section 21C. Thus, the first switching element 41A is electrically connected to the third wiring section 21C. The wires 501 bonded to the obverse surface electrode 411 of the second switching element 41B are bonded to the obverse surface 211 of the second wiring section 21B. Thus, the second switching element 41B is electrically connected to the second wiring section 21B.

As shown in FIG. 11, the reverse surface electrodes 412 are located closer to the obverse surfaces 211 of the wiring parts 21 in the thickness direction z. Thus, in each of the first switching element 41A and the second switching element 41B, the reverse surface electrode 412 is located opposite to the obverse surface electrode 411. In each of the first switching element 41A and the second switching element 41B, drain current flows through the reverse surface electrode 412 toward the inside of the switching element. The reverse surface electrode 412 of the first switching element 41A is bonded to the obverse surface 211 of the first wiring section 21A with a conductive bonding layer 49. Thus, the first switching element 41A is electrically connected to the first wiring section 21A. The reverse surface electrode 412 of the second switching element 41B is bonded to the obverse surface 211 of the third wiring section 21C with a conductive bonding layer 49. Thus, the second switching element 41B is electrically connected to third wiring section 21C. The bonding layers 49 are made of lead-free solder containing tin (Sn) as a main component or baked silver, for example.

As shown in FIG. 11, the gate electrode 413 is generally at the same position as the obverse surface electrodes 411 in the thickness direction z. In each of the first switching element 41A and the second switching element 41B, a gate voltage for driving the switching element is applied to the gate electrode 413. As shown in FIG. 10, the gate electrode 413 is smaller in size than each of the four divided portions of the obverse surface electrode 411.

As shown in FIGS. 3 and 9, each of the first diode 42A and the second diode 42B is bonded to the obverse surface 211 of one of the wiring parts 21. As viewed along the thickness direction z, the first diode 42A and the second diode 42B are both rectangular (square in the semiconductor device A10). In the example of the semiconductor device A10, both the first diode 42A and the second diode 42B are Schottky barrier diodes containing silicon carbide (SiC) as the main semiconductor material.

As shown in FIGS. 10 and 11, each of the first diode 42A and the second diode 42B has an anode electrode 421 and a cathode electrode 422.

As shown in FIG. 11, the anode electrodes 421 are located farther from the obverse surfaces 211 of the wiring parts 21 in the thickness direction z. Each anode electrode 421 is the positive electrode of the first diode 42A or the second diode 42B. As shown in FIG. 10, a plurality of wires 501 are bonded to the anode electrode 421. The wires 501 bonded to the anode electrode 421 of the first diode 42A are bonded to the obverse surface 211 of one of the paired fourth wiring sections 21D that is closer to the first switching element 41A. Thus, the first diode 42A is electrically connected to the fourth wiring section 21D. The wires 501 bonded to the anode electrode 421 of the second diode 42B are bonded to the obverse surface 211 of the second wiring section 21B. Thus, the second diode 42B is electrically connected to the second wiring section 21B. The second diode 42B is connected in parallel with the second switching element 41B to the second wiring section 21B (see FIGS. 14 and 15). Thus, the second diode 42B forms a freewheeling diode for the second switching element 41B.

As shown in FIG. 11, the cathode electrodes 422 are located closer to the obverse surfaces 211 of the wiring parts 21 in the thickness direction z. Thus, in each of the first diode 42A and the second diode 42B, the cathode electrode 422 is located opposite to the anode electrode 421. Each cathode electrode 422 is the negative electrode of the first diode 42A or the second diode 42B. The cathode electrode 422 of the first diode 42A is bonded to the obverse surface 211 of the first wiring section 21A with a conductive bonding layer 49. Thus, the first diode 42A is electrically connected to the first wiring section 21A. The first diode 42A is connected in parallel with the first switching element 41A to the first wiring section 21A (see FIGS. 14 and 15). Thus, the first diode 42A forms a freewheeling diode for the first switching element 41A. The cathode electrode 422 of the second diode 42B is bonded, with a conductive bonding layer 49, to the obverse surface 211 of one of the paired fourth wiring sections 21D that is closer to the second switching element 41B. Thus, the second diode 42B is electrically connected to the fourth wiring section 21D.

As shown in FIG. 3, the paired gate terminals 33 are on each side of the wiring parts 21 in the second direction y. A gate voltage for driving the first switching element 41A or the second switching element 41B is applied to each of the paired gate terminals 33. Each of the paired gate terminals 33 has a pad portion 331 and a terminal portion 332.

As shown in FIG. 3, the pad portions 331 are spaced apart from the support member 10 and covered with the sealing resin 60. Thus, the paired gate terminals 33 are supported by the sealing resin 60. A pair of gate wires 502 are individually bonded to the pad portions 331 of the pair of gate terminals 33. The paired gate wires 502 are made of a metal including gold or aluminum, for example. The one of the paired gate wires 502 that is bonded to the one of the pad portions 331 of the gate terminals 33 that is closer to the first wiring section 21A is bonded to the gate electrode 413 of the first switching element 41A. The other one of the paired gate wires 502 that is bonded to the other one of the pad portions 331 of the gate terminals 33 that is closer to the third wiring section 21C is bonded to the gate electrode 413 of the second switching element 41B. The surfaces of the pad portions 311 may be plated with silver.

As shown in FIG. 3, the terminal portions 332 are connected to the pad portions 331 and exposed from the sealing resin 60. The terminal portions 332 are used in mounting the semiconductor device A10 to a circuit board. Each terminal portion 332 has a base part 332A and a standing part 332B. The base parts 332A are connected to the pad portions 331 and extend out from the sealing resin 60 in the second direction y. The dimension of each base part 332A in the second direction y is smaller than the dimension of each base part 312A of the paired input terminals 31 and the dimension of each base part 322A of the paired output terminals 32 in the second direction y. As shown in FIGS. 5 and 6, each standing part 332B extends from the end of a base part 332A in the second direction y toward the side which the obverse surfaces 211 of the wiring parts 21 face in the thickness direction z shown in FIG. 8. Thus, as viewed along the first direction x, each terminal portion 332 is L-shaped. The surfaces of the terminal portions 332 may be plated with nickel, for example.

As shown in FIG. 3, the paired detection terminals 34 are arranged adjacent to the paired gate terminals 33 on each side of the wiring parts 21 in the second direction y. A voltage corresponding to the source current flowing through the obverse surface electrode 411 of the first switching element 41A or the second switching element 41B is applied to each of the paired detection terminals 34. In a circuit formed on the circuit board on which the semiconductor device A10 is mounted, the source current flowing through each of the first switching element 41A and the second switching element 41B is detected based on the voltage applied to each of the paired detection terminals 34. Each of the detection terminals 34 has a pad portion 341 and a terminal portion 342.

As shown in FIG. 3, the pad portions 341 are spaced apart from the support member 10 and covered with the sealing resin 60. Thus, the paired detection terminals 34 are supported by the sealing resin 60. A pair of detection wires 503 are individually bonded to pad portions 341 of the pair of the detection terminals 34. The paired detection wires 503 are made of a metal including gold or aluminum, for example. The one of the paired detection wires 503 that is bonded to the one of the pad portions 341 of the detection terminals 34 that is closer to the first wiring section 21A is bonded to the obverse surface electrode 411 of the first switching element 41A. The other one of the paired detection wires 503 that is bonded to the other one of the pad portions 341 of the detection terminals 34 that is closer to the third wiring section 21C is bonded to the obverse surface electrode 411 of the second switching element 41B. The surfaces of the pad portions 341 may be plated with silver.

As shown in FIG. 3, the terminal portions 342 are connected to the pad portions 341 and exposed from the sealing resin 60. The terminal portions 342 are used in mounting the semiconductor device A10 to a circuit board. Each terminal portion 342 has a base part 342A and a standing part 342B. The base parts 342A are connected to the pad portions 341 and extend out from the sealing resin 60 in the second direction y. The dimension of each base part 342A in the second direction y is generally equal to the dimension of each base part 332A of the paired gate terminals 33 in the second direction y. As shown in FIGS. 5 and 6, each standing part 342B extends from the end of a base part 332A in the second direction y toward the side which the obverse surfaces 211 of the wiring parts 21 face in the thickness direction z shown in FIG. 8. Thus, as viewed along the first direction x, each terminal portion 342 is L-shaped. The surfaces of the terminal portions 342 may be plated with nickel, for example.

As shown in FIG. 3, the first conduction member 51A, the second conduction member 51B, the third conduction member 51C and the fourth conduction member 51D provide a conduction path between the wiring parts 21 and the first input terminal 31A, the second input terminal 31B, the first output terminal 32A or the second output terminal 32B. These conduction members are covered with the sealing resin 60. In the semiconductor device A10, each of these conduction members is constituted of a plurality of wires.

The wires are made of a metal including aluminum. Note that each of these conduction members may be constituted of a metal lead containing copper, instead of wires.

As shown in FIGS. 3 and 8, the conduction member 51A is bonded to the pad portion 311 of the first input terminal 31A and the obverse surface 211 of the first wiring section 21A. Thus, the first input terminal 31A is electrically connected to both the reverse surface electrode 412 of the first switching element 41A and the cathode electrode 422 of the first diode 42A.

As shown in FIG. 3, the second conduction member 51B is bonded to the pad portion 311 of the second input terminal 31B and the obverse surface 211 of the second wiring section 21B. Thus, the second input terminal 31B is electrically connected to both the obverse surface electrode 411 of the second switching element 41B and the anode electrode 421 of the second diode 42B.

As shown in FIGS. 3 and 8, the third conduction member 51C is bonded to the pad portion 321 of the first output terminal 32A and the obverse surface 211 of the third wiring section 21C. Thus, the first output terminal 32A is electrically connected to the obverse surface electrode 411 of the first switching element 41A and the reverse surface electrode 412 of the second switching element 41B.

As shown in FIG. 3, the fourth conduction member 51D is bonded to the obverse surface 211 of each of the paired fourth wiring sections 21D. Two of the wires that constitute the fourth conduction member 51D are bonded to the obverse surface 211 of the fourth wiring section 21D on which the second diode 42B is bonded and to the pad portion 321 of the second output terminal 32B. Thus, the second output terminal 32B is electrically connected to both the anode electrode 421 of the first diode 42A and the cathode electrode 422 of the second diode 42B.

Figure 12:
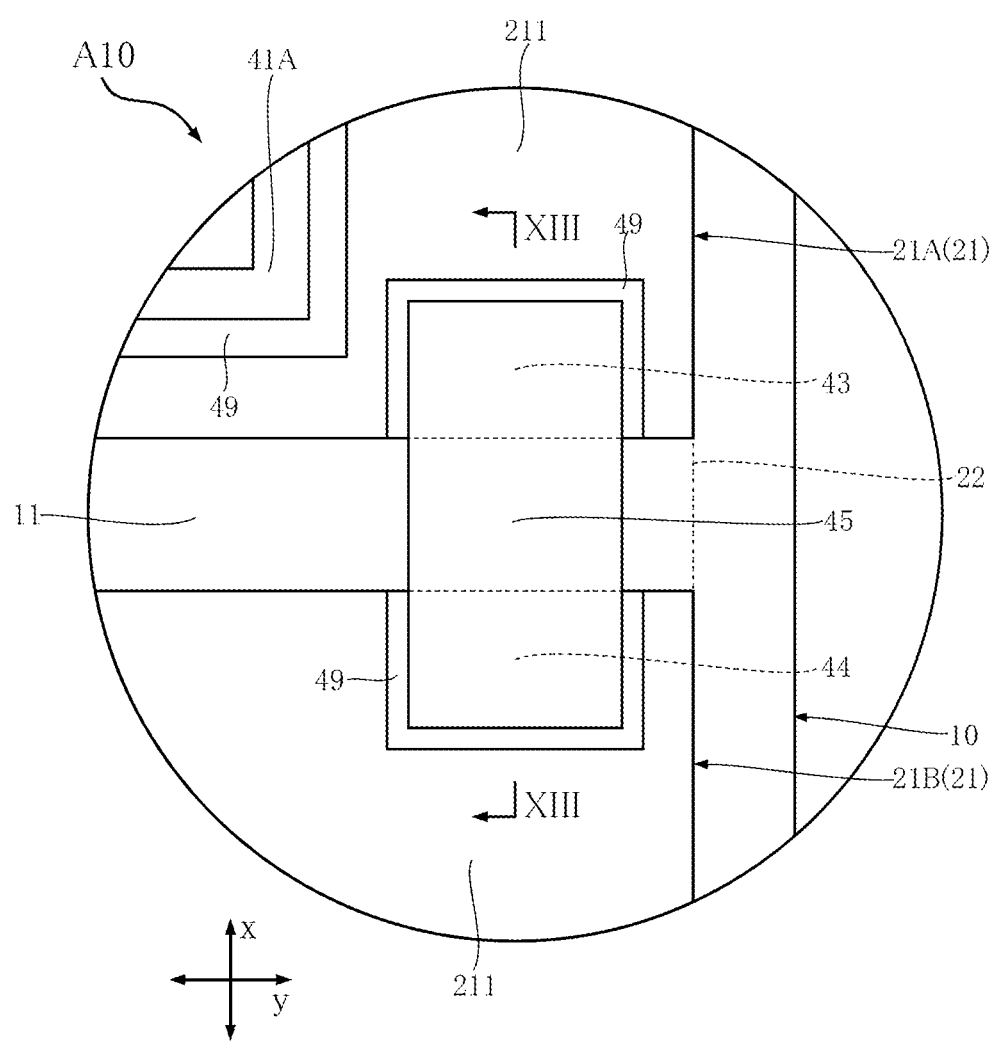
FIG. 12 is a partial enlarged view of FIG. 3.
Figure 13:
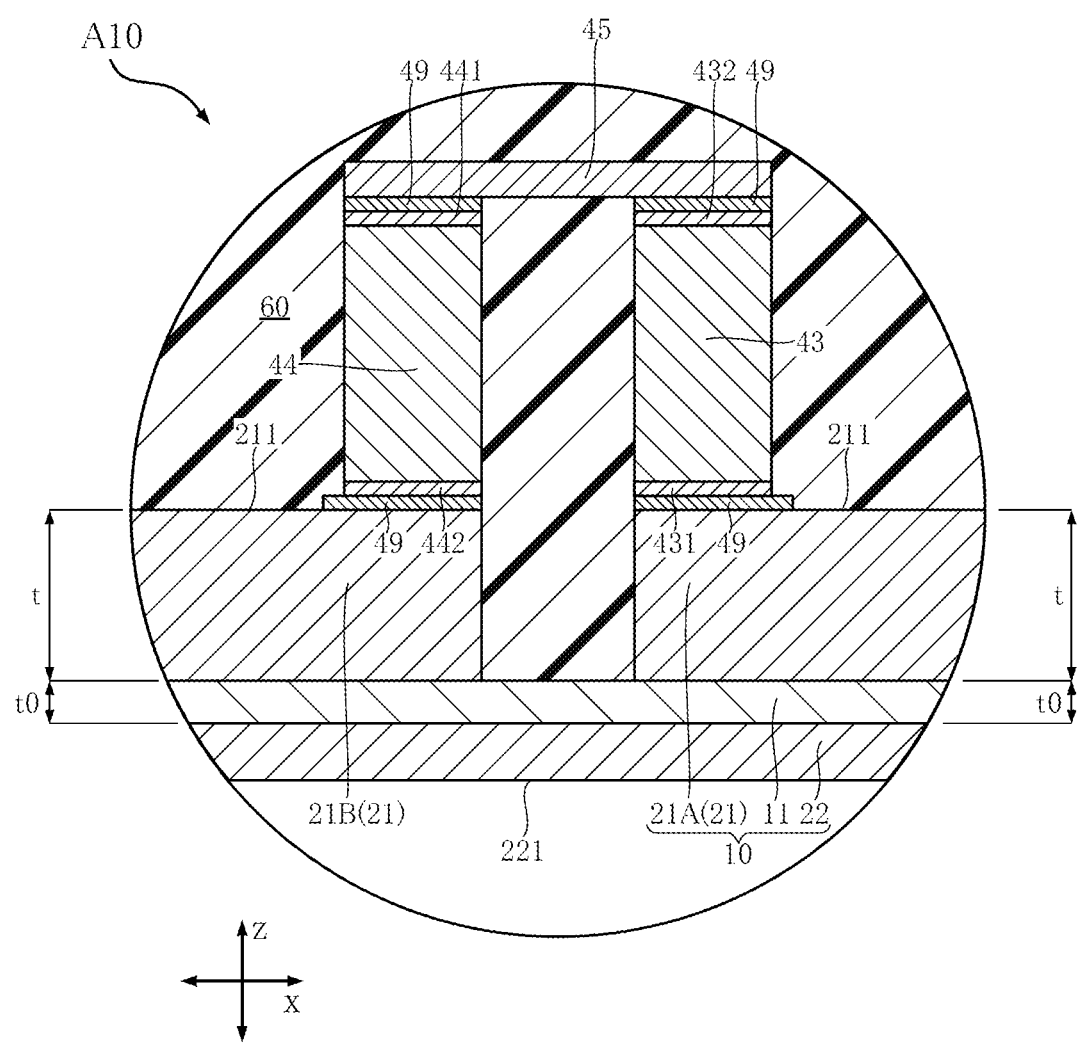
FIG. 13 is a sectional view taken along line XIII-XIII in FIG. 12.

As shown in FIGS. 3, 12 and 13, the first passive element 43 is arranged on the obverse surface 211 of the first wiring section 21A. The first passive element 43 is a capacitor. In the example of the semiconductor device A10, the first passive element 43 is a ceramic capacitor or a film capacitor. The first passive element 43 has a first electrode 431 and a second electrode 432 that are spaced apart from each other. Of these, the first electrode 431 is bonded to the obverse surface 211 of the first wiring section 21A with a bonding layer 49. Thus, the first electrode 431 is electrically connected to both the reverse surface electrode 412 of the first switching element 41A and the cathode electrode 422 of the first diode 42A.

As shown in FIGS. 3, 12 and 13, the second passive element 44 is arranged on the obverse surface 211 of the second wiring section 21B. The second passive element 44 is a capacitor. In the example of the semiconductor device A10, the second passive element 44 is a ceramic capacitor or a film capacitor. The second passive element 44 has a third electrode 441 and a fourth electrode 442 that are spaced apart from each other. Of these, the fourth electrode 442 is bonded to the obverse surface 211 of the second wiring section 21B with a bonding layer 49. Thus, the fourth electrode 442 is electrically connected to both the obverse surface electrode 411 of the first switching element 41A and the anode electrode 421 of the second diode 42B.

As shown in FIG. 13, in the semiconductor device A10, the first electrode 431 and the second electrode 432 of the first passive element 43 are spaced apart from each other in the thickness direction z. The third electrode 441 and the fourth electrode 442 of the second passive element 44 are spaced apart from each other in the thickness direction z. The first passive element 43 and the second passive element 44 are spaced apart from each other in the first direction x.

As shown in FIG. 13, the electrical conductor 45 connects the second electrode 432 of the first passive element 43 and the third electrode 441 of the second passive element 44. Thus, the first passive element 43 and the second passive element 44 are connected in series to each other. In the semiconductor device A10, the electrical conductor 45 is a metal piece. The metal piece contains copper, for example. The electrical conductor 45 is spaced apart from the wiring parts 21 in the thickness direction z. The electrical conductor 45 is bonded to both the second electrode 432 and the third electrode 441 with a bonding layer 49. Thus, the electrical conductor 45 is supported on both the first passive element 43 and the second passive element 44.

As shown in FIG. 14, between the first input terminal 31A and the second input terminal 31B, the first and second switching elements 41A, 41B and the first and second passive elements 43, 44 are connected in parallel to each other. Thus, the first passive element 43 and the second passive element 44 form a snubber circuit for the semiconductor device A10. As the snubber circuit, the first passive element 43 may be a resistor, and the second passive element 4 may be a capacitor (RC snubber), as shown in FIG. 15.

As shown in FIGS. 8, 9 and 13, the sealing resin 60 covers the insulating substrate 11, the wiring parts 21, the first switching element 41A, the second switching element 41B, the first diode 42A, the second diode 42B, the first passive element 43, the second passive element 44, and the electrical conductor 45. The sealing resin 60 covers a part of the heat dissipator 22. The sealing resin 60 further covers the wires 501, the paired gate wires 502, and the paired detection wires 503. The sealing resin 60 is made of a material mainly composed of epoxy resin. As shown in FIGS. 2-9 (excluding FIG. 3), the sealing resin 60 has a top surface 61, a bottom surface 62, a pair of first side surfaces 63A, a pair of second side surfaces 63B, and a pair of mounting holes 64

As shown in FIGS. 8 and 9, the top surface 61 faces the side which the obverse surface 211 of the wiring parts 21 face in the thickness direction z. The bottom surface 62 faces away from the top surface 61. As shown in FIG. 4, the reverse surface 221 of the heat dissipator 22 is exposed from the bottom surface 62. The bottom surface 62 is located around the reverse surface 221.

As shown in FIGS. 2-6, the paired first side surfaces 63A are connected to both the top surface 61 and the bottom surface 62 and spaced apart from each other in the first direction x. As shown in FIGS. 2-4 and 7, the paired second side surfaces 63B are connected to both the top surface 61 and the bottom surface 62 and spaced apart from each other in the second direction y. Each of the paired second side surfaces 63B is connected to the paired first side surfaces 63A at each end in the first direction x. From the second side surface 63B located on one side in the second direction y, the terminal portions 312 of the paired input terminals 31, as well as the terminal portion 332 of one of the paired gate terminals 33 and the terminal portion 342 of one of the paired detection terminals 34 that are arranged to correspond to the first switching element 41A are exposed. From the second side surface 63B located on the other side in the second direction y, the terminal portions 322 of the paired output terminals 32, as well as the terminal portion 332 of one of the paired gate terminals 33 and the terminal portion 342 of one of the paired detection terminals 34 that are arranged to correspond to the second switching element 41B are exposed.

As shown in FIGS. 2, 4 and 9, the pair of mounting holes 64 penetrate the sealing resin 60 from the top surface 61 to the bottom surface 62 in the thickness direction z. As viewed along the thickness direction z, the edge of the mounting holes 64 is circular. The paired mounting holes 64 are located on each side of the insulating substrate 11 in the second direction y. The paired mounting holes 64 are used in mounting the semiconductor device A10 to a heat sink.

The advantages of the semiconductor device A10 are described below.

The semiconductor device A10 includes a support member 10 that includes a plurality of wiring parts 21 including the first wiring section 21A and the second wiring section 21B spaced apart from each other in the first direction x, the first passive element 43, the second passive element 44, and the electrical conductor 45. The first electrode 431 of the first passive element 43 is bonded to the first wiring section 21A. The fourth electrode 442 of the second passive element 44 is bonded to the second wiring section 21B. The electrical conductor 45 connects the second electrode 432 of the first passive element 43 and the third electrode 441 of the second passive element 44 to each other. At least one of the first passive element 43 and the second passive element 44 is a capacitor. Thus, the first passive element 43 and the second passive element 44 are connected in series to each other between the first wiring section 21A and the second wiring section 21B and form a snubber circuit for the semiconductor device A10. Thus, the surge voltage generated in the semiconductor device A10 by driving the first switching element 41A and the second switching element 41B is reduced. Moreover, this arrangement eliminates the need for forming a snubber circuit for connection to the semiconductor device A10 on a circuit board to which the semiconductor device A10 is mounted. Thus, an increase in size of the circuit board is avoided. In this way, the semiconductor device A10 allows for avoiding an increase in size of a circuit board on which the device is mounted while reducing the surge voltage generated in the device.

Both the first passive element 43 and the second passive element 44 are capacitors. This enhances the dielectric breakdown voltage of the snubber circuit. Using a resistor as either one of the first passive element 43 and the second passive element 44 provides an RC snubber as a snubber circuit. When oscillation of the surge voltage generated in the semiconductor device A10 is noticeable, the RC snubber damps such oscillation.

In the semiconductor device A10, the first electrode 431 and the second electrode 432 of the first passive element 43 are spaced apart from each other in the thickness direction z, so are the third electrode 441 and the fourth electrode 442 of the second passive element 44. The first passive element 43 and the second passive element 44 are spaced apart from each other in the first direction x. Such an arrangement reduces the mounting area of the first passive element 43 on the first wiring section 21A and the mounting area of the second passive element 44 on the second wiring section 21B. The electrical conductor 45 is spaced apart from the wiring parts 21 in the thickness direction z and supported by both the second electrode 432 and third electrode 441. With such an arrangement, the electrical conductor 45 is held stably, and the size of the electrical conductor 45 can be made as small as possible.

The support member 10 further includes the insulating substrate 11 to which the wiring parts 21 are fixed, and the heat dissipator 22 fixed to the insulating substrate 11. The heat dissipator 22 is located opposite to the wiring parts 21 with respect to the insulating substrate 11 in the thickness direction z. The semiconductor device A10 further includes the sealing resin 60. The sealing resin 60 covers the insulating substrate 11 and the wiring parts 21. The heat dissipator 22 is exposed from the sealing resin 60 and overlaps with the wiring parts 21 in the thickness direction z. This allows the heat generated from the first switching element 41A and the second switching element 41B to be efficiently dissipated during the use of the semiconductor device A10. Moreover, as viewed along the thickness direction z, the heat dissipator 22 is located inward of the peripheral edge of the insulating substrate 11. Thus, as shown in FIGS. 8 and 9, the surface of the insulating substrate 11 to which the heat dissipator 22 is fixed is in contact with the sealing resin 60. This prevents the support member 10 from coming off the sealing resin 60.

The semiconductor device A10 further includes the first diode 42A and the second diode 42B. The first diode 42A is connected in parallel with the first switching element 41A to the first wiring section 21A. The second diode 42B is connected in parallel with the second switching element 41B to the second wiring section 21B. Such an arrangement prevents reverse current from flowing through the first switching element 41A and the second switching element 41B during the use of the semiconductor device A10. Moreover, in a load such as a motor connected to the paired output terminals 32, energy is stored in the inductance of the load. The first diode 42A and the second diode 42B function to return the energy to the DC power supply E connected to the paired input terminals 31 (see FIGS. 14 and 15).

Figure 16:
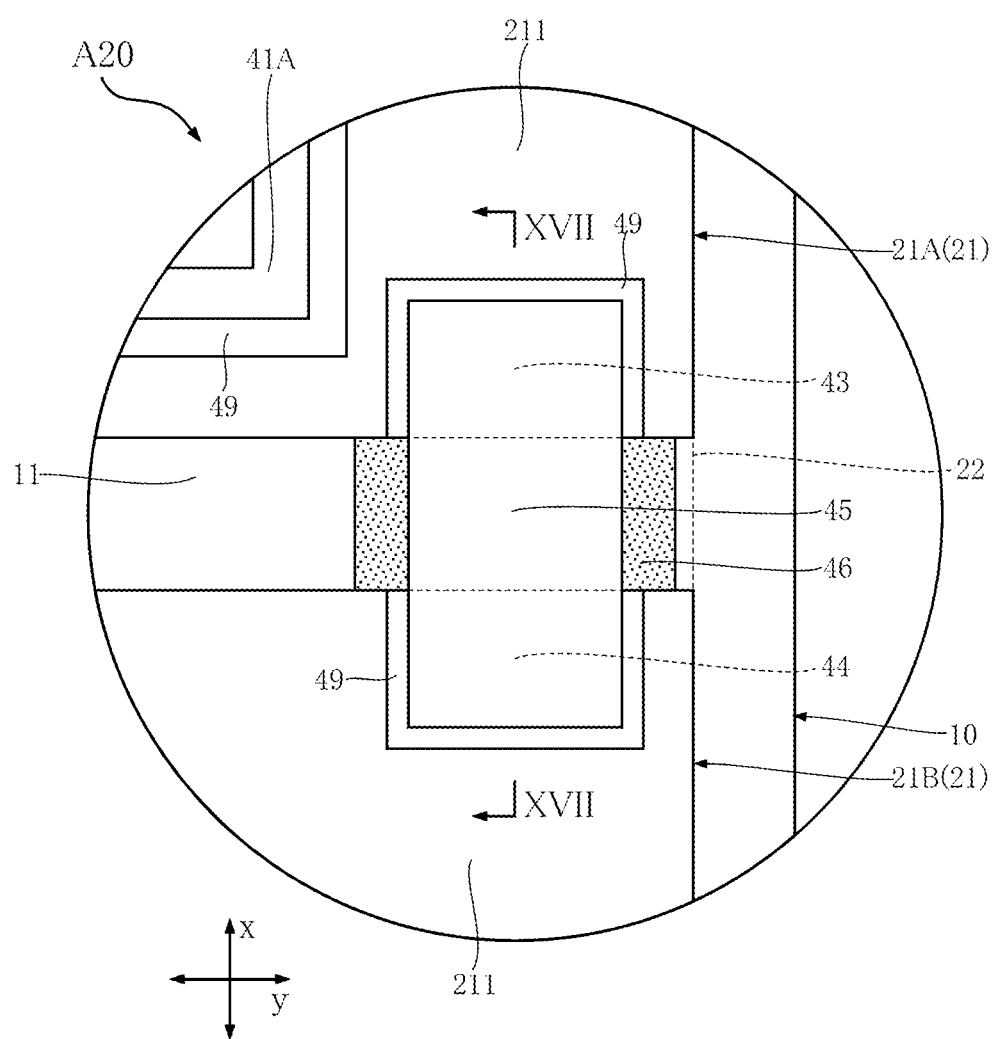
FIG. 16 is a partial enlarged plan view of a semiconductor device according to a second embodiment (as seen through the sealing resin)

A semiconductor device A20 according to a second embodiment will be described with reference to FIGS. 16 and 17. In these figures, the elements that are identical or similar to those of the semiconductor device A10 are denoted by the same reference signs, and the description is omitted. In FIG. 16, the sealing resin 60 is illustrated as transparent.

The semiconductor device A20 differs from the semiconductor device A10 in that it includes an electrical insulator 46.

Figure 17:
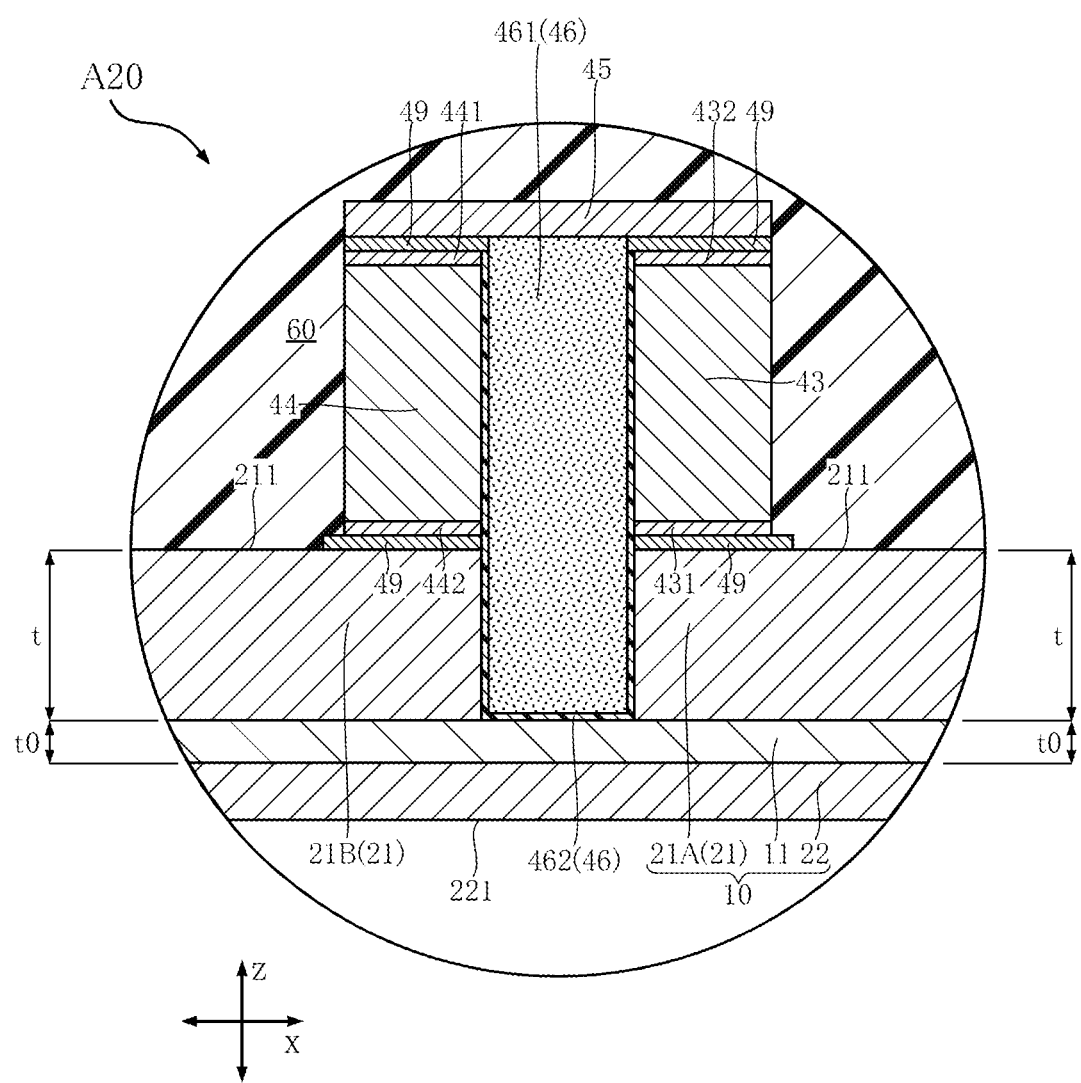
FIG. 17 is a sectional view taken along lines XVII-XVII in FIG. 16.

As shown in FIGS. 16 and 17, the electrical insulator 46 is located between the first passive element 43 and the second passive element 44. The electrical insulator 46 is thermally conductive. The electrical insulator 46 has an insulating body 461 and an adhesive layer 462. The insulating body 461 is a ceramic material containing silicon nitride or aluminum nitride, for example. Thus, the insulating body 461 has a relatively high thermal conductivity. The upper surface of the insulating body 461 is in contact with the electrical conductor 45. The adhesive layer 462 covers a part of the surface of the insulating body 461. The adhesive layer 462 is electrically insulating. The adhesive layer 462 is made of a material containing a synthetic resin containing fine powder of an electrically insulating material, such as aluminum nitride, which has a relatively high thermal conductivity. In the semiconductor device A20, the adhesive layer 462 is in contact with the insulating substrate 11, the first wiring section 21A, the second wiring section 21B, the first passive element 43 and the second passive element 44. Thus, the electrical insulator 46 is in contact with the insulating substrate 11, the electrical conductor 45, and at least one of the first wiring section 21A and the second wiring section 21B.

The advantages of the semiconductor device A20 are described below.

The semiconductor device A20 includes a support member 10 that includes a plurality of wiring parts 21 including the first wiring section 21A and the second wiring section 21B spaced apart from each other in the first direction x, the first passive element 43, the second passive element 44, and the electrical conductor 45. The first electrode 431 of the first passive element 43 is bonded to the first wiring section 21A. The fourth electrode 442 of the second passive element 44 is bonded to the second wiring section 21B. The electrical conductor 45 connects the second electrode 432 of the first passive element 43 and the third electrode 441 of the second passive element 44 to each other. At least one of the first passive element 43 and the second passive element 44 is a capacitor. Thus, the semiconductor device A20 also allows for avoiding an increase in size of a circuit board on which the device is mounted while reducing the surge voltage generated in the device.

The semiconductor device A20 further includes the electrical insulator 46 that is located between the first passive element 43 and the second passive element 44 and thermally conductive. The electrical insulator 46 is in contact with the electrical conductor 45 and at least one of the first wiring section 21A and the second wiring section 21B. Thus, during the use of the semiconductor device A20, heat generated from the first passive element 43 and the second passive element 44 is easily conducted to either one of the first wiring section 21A and the second wiring section 21B. This reduces temperature increase in the first passive element 43 and the second passive element 44. Since the electrical insulator 46 is in contact with the insulating substrate 11, the heat generated from the first passive element 43 and the second passive element 44 is dissipated more efficiently.

Figure 18:
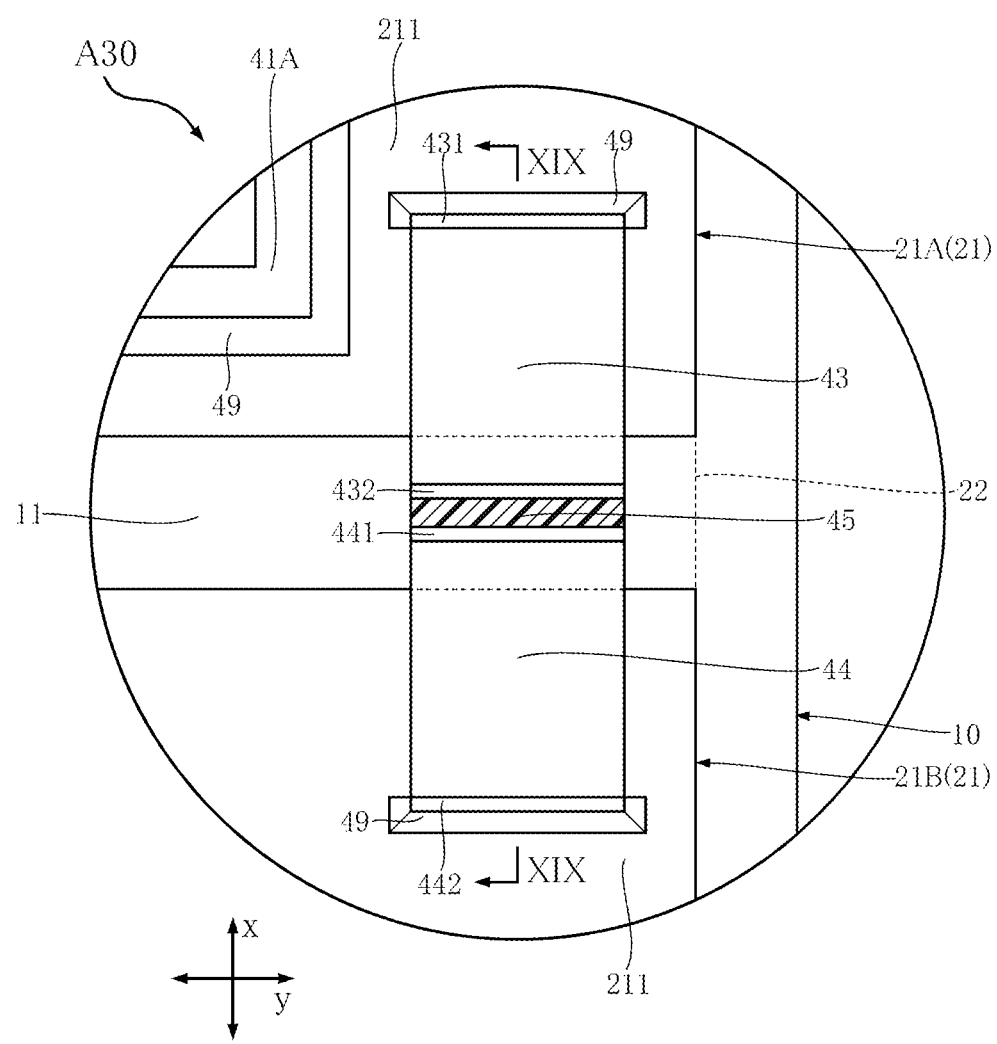
FIG. 18 is a partial enlarged plan view of a semiconductor device according to a third embodiment (as seen through the sealing resin)

A semiconductor device A30 according to a third embodiment is described with reference to FIGS. 18 and 19. In these figures, the elements that are identical or similar to those of the semiconductor device A10 are denoted by the same reference signs, and the description is omitted. In FIG. 18, the sealing resin 60 is illustrated as transparent.

The semiconductor device A30 differs from the semiconductor device A10 in configuration of the first passive element 43, the second passive element 44 and the electrical conductor 45.

Figure 19:
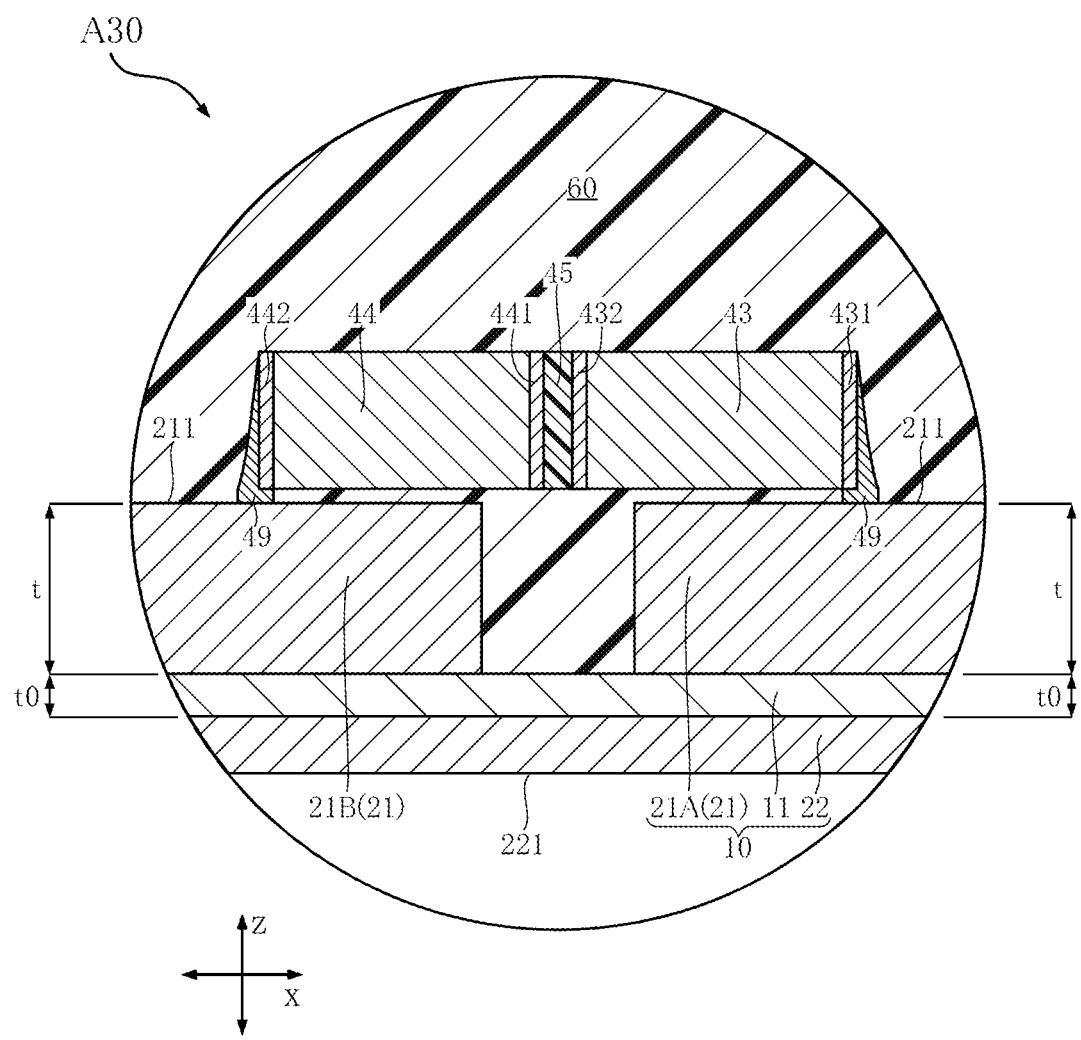
FIG. 19 is a sectional view taken along line XIX-XIX in FIG. 18.

As shown in FIGS. 18 and 19, in the semiconductor device A30, the first electrode 431 and the second electrode 432 of the first passive element 43 are spaced apart from each other in the first direction x. The third electrode 441 and the fourth electrode 442 of the second passive element 44 are also spaced apart from each other in the first direction x. As viewed along the thickness direction z, the electrical conductor 45, the second electrode 432 and the third electrode 441 are located between the first wiring section 21A and the second wiring section 21B.

In the semiconductor device A30, the electrical conductor 45 is made of a material containing a synthetic resin containing particles of a metal such as silver, for example. In the semiconductor device A30 again, the electrical conductivity of the electrical conductor 45 is secured. The Young's modulus of the electrical conductor 45 is smaller than that of the first wiring section 21A and that of the second wiring section 21B.

The advantages of the semiconductor device A30 are described below.

The semiconductor device A30 includes a support member 10 that includes a plurality of wiring parts 21 including the first wiring section 21A and the second wiring section 21B spaced apart from each other in the first direction x, the first passive element 43, the second passive element 44, and the electrical conductor 45. The first electrode 431 of the first passive element 43 is bonded to the first wiring section 21A. The fourth electrode 442 of the second passive element 44 is bonded to the second wiring section 21B. The electrical conductor 45 connects the second electrode 432 of the first passive element 43 and the third electrode 441 of the second passive element 44 to each other. At least one of the first passive element 43 and the second passive element 44 is a capacitor. Thus, the semiconductor device A30 also allows for avoiding an increase in size of a circuit board on which the device is mounted while reducing the surge voltage generated in the device.

In the semiconductor device A30, the first electrode 431 and the second electrode 432 of the first passive element 43 are spaced apart from each other in the first direction x, so are the third electrode 441 and the fourth electrode 442 of the second passive element 44. As viewed along the thickness direction z, the electrical conductor 45, the second electrode 432 and the third electrode 441 are located between the first wiring section 21A and the second wiring section 21B. Such an arrangement prevents current short circuit in each of the first passive element 43 and the second passive element 44. Further, the Young's modulus of the electrical conductor 45 is smaller than that of the first wiring section 21A and that of the second wiring section 21B. Thus, the electrical conductor 45 has a higher flexibility than the wiring section 21A and the second wiring section 21B. Thus, during the use of the semiconductor device A30, the thermal strain generated in the first passive element 43 and the second passive element 44 is absorbed by the electrical conductor 45, which prevents cracking of the first passive element 43 and the second passive element 44.

Figure 20:
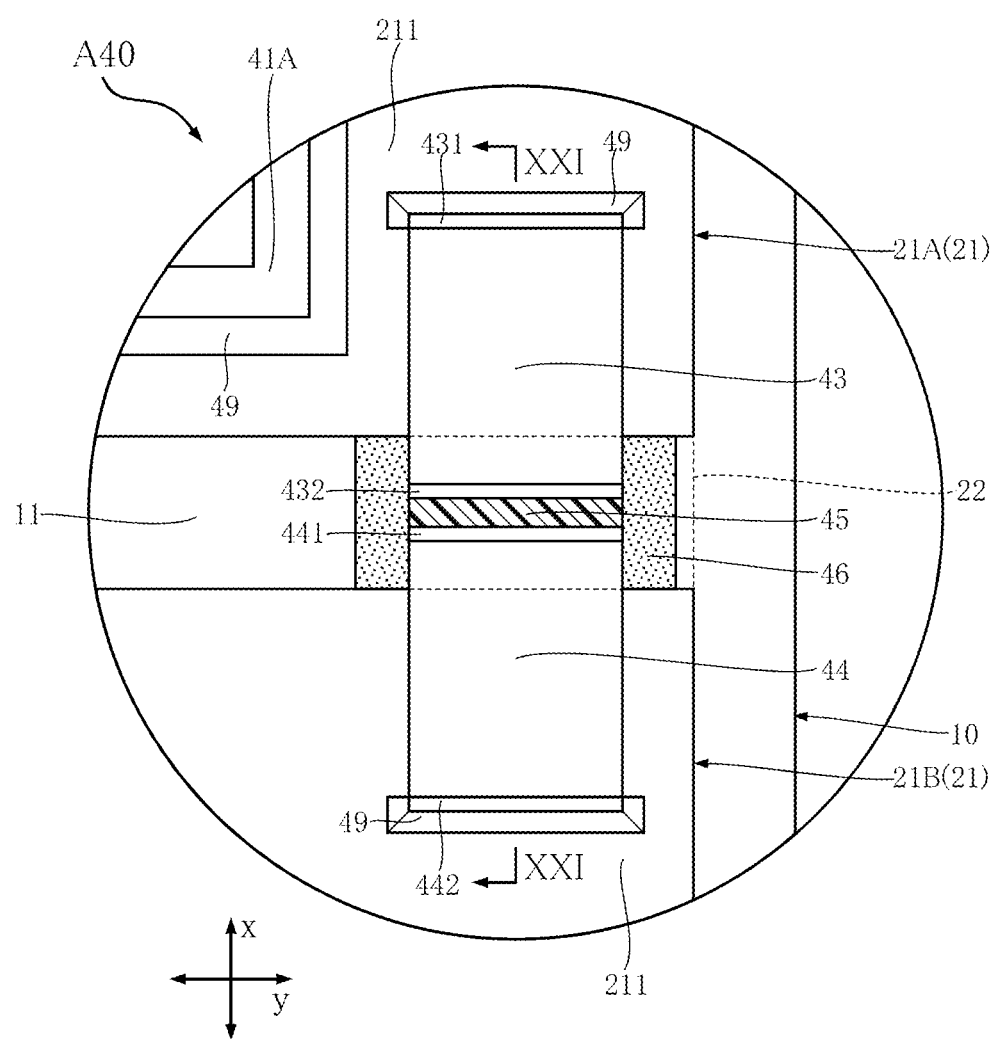
FIG. 20 is a partial enlarged plan view of a semiconductor device according to a fourth embodiment (as seen through the sealing resin)

A semiconductor device A40 according to a fourth embodiment is described with reference to FIGS. 20 and 21. In these figures, the elements that are identical or similar to those of the semiconductor device A10 are denoted by the same reference signs, and the description is omitted. In FIG. 20, the sealing resin 60 is illustrated as transparent.

The semiconductor device A40 differs from the semiconductor device A30 in that it includes the electrical insulator 46.

Figure 21:
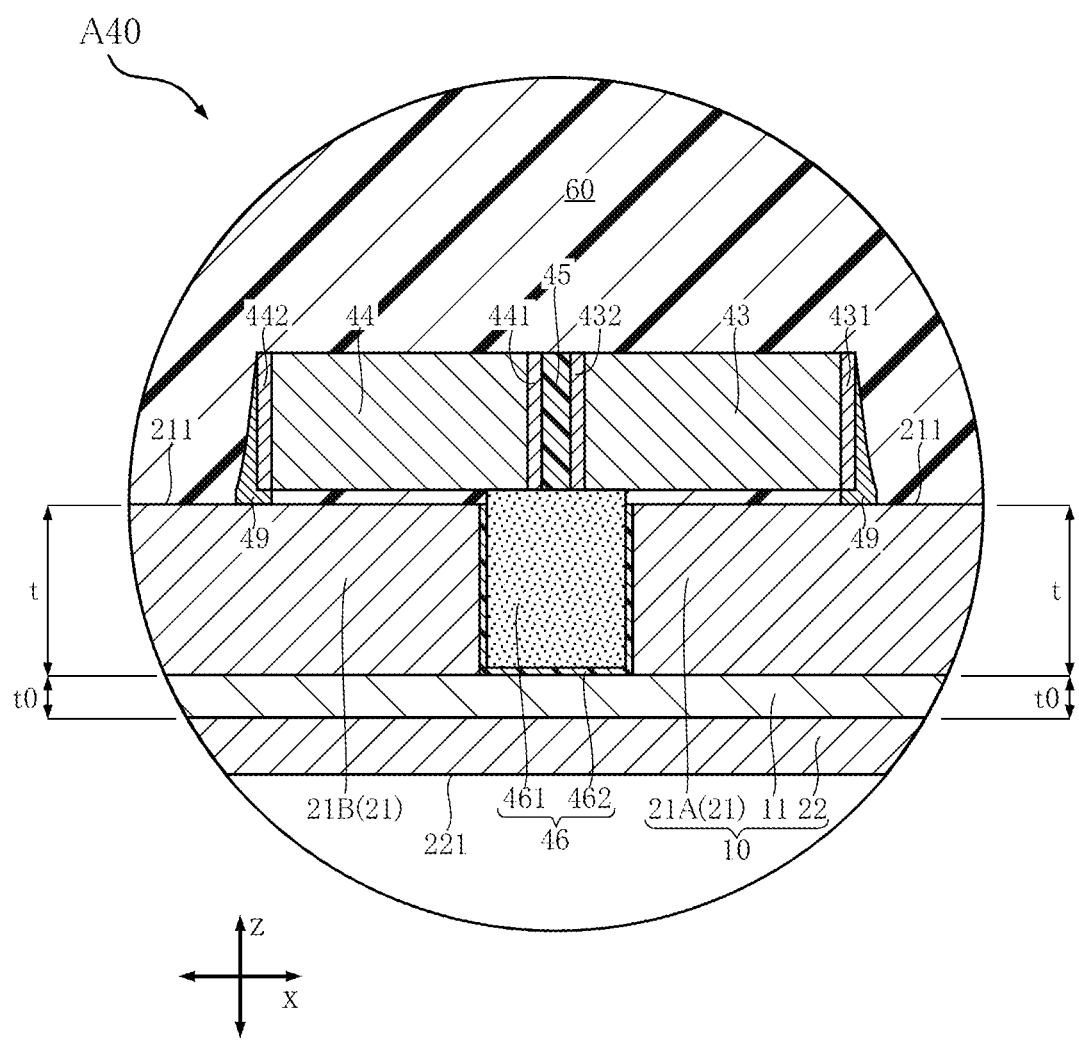
FIG. 21 is a sectional view taken along line XXI-XXI in FIG. 20.

As shown in FIGS. 20 and 21, the electrical insulator 46 is located between the first wiring section 21A and the second wiring section 21B. The material compositions of the insulating body 461 and the adhesive layer 462 of the electrical insulator 46 are the same as those of the insulating body 461 and the adhesive layer 462 of the electrical insulator 46 in the semiconductor device A20. The upper surface of the insulating body 461 is in contact with the electrical conductor 45, the second electrode 432 of the first passive element 43, and the third electrode 441 of the second passive element 44. The adhesive layer 462 covers a part of the surface of the insulating body 461. In the semiconductor device A40, the adhesive layer 462 is in contact with the insulating substrate 11, the first wiring section 21A and the second wiring section 21B. Thus, the electrical insulator 46 is in contact with the insulating substrate 11, the electrical conductor 45, and at least one of the first wiring section 21A and the second wiring section 21B.

The advantages of the semiconductor device A40 are described below.

The semiconductor device A40 includes a support member 10 that includes a plurality of wiring parts 21 including the first wiring section 21A and the second wiring section 21B spaced apart from each other in the first direction x, the first passive element 43, the second passive element 44, and the electrical conductor 45. The first electrode 431 of the first passive element 43 is bonded to the first wiring section 21A. The fourth electrode 442 of the second passive element 44 is bonded to the second wiring section 21B. The electrical conductor 45 connects the second electrode 432 of the first passive element 43 and the third electrode 441 of the second passive element 44 to each other. At least one of the first passive element 43 and the second passive element 44 is a capacitor. Thus, the semiconductor device A40 also allows for avoiding an increase in size of a circuit board on which the device is mounted while reducing the surge voltage generated in the device.

The semiconductor device A40 further includes the electrical insulator 46 that is located between the first wiring section 21A and the second wiring section 21B and thermally conductive. The electrical insulator 46 is in contact with the electrical conductor 45 and at least one of the first wiring section 21A and the second wiring section 21B. Thus, during the use of the semiconductor device A40, heat generated from the first passive element 43 and the second passive element 44 is easily conducted to either one of the first wiring section 21A and the second wiring section 21B. This reduces temperature increase in the first passive element 43 and the second passive element 44. Since the electrical insulator 46 is in contact with the insulating substrate 11, the heat generated from the first passive element 43 and the second passive element 44 is dissipated more efficiently.

Figure 22:
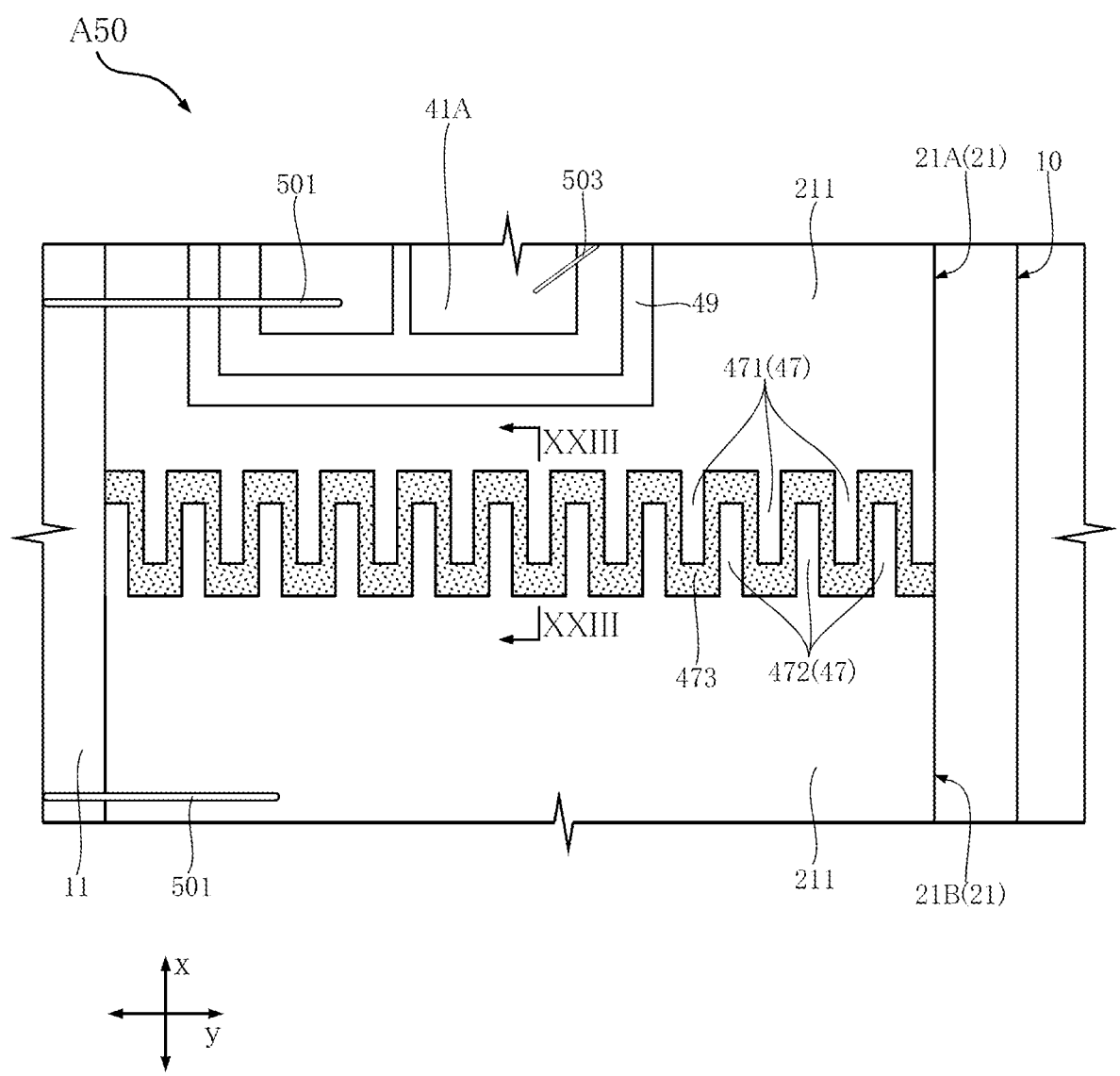
FIG. 22 is a partial enlarged plan view of a semiconductor device according to a fifth embodiment (as seen through the sealing resin)

A semiconductor device A50 according to a fifth embodiment is described with reference to FIGS. 22 and 23. In these figures, the elements that are identical or similar to those of the semiconductor device A10 are denoted by the same reference signs, and the description is omitted. In FIG. 22, the sealing resin 60 is illustrated as transparent.

The semiconductor device A50 differs from the semiconductor device A10 in that it includes a snubber capacitor 47 instead of the first passive element 43, the second passive element 44 and the electrical conductor 45.

As shown in FIG. 22, the snubber capacitor 47 is located between the first wiring section 21A and the second wiring section 21B. The snubber capacitor 47 has a plurality of first conducting portions 471, a plurality of second conducting portions 472, and an insulating portion 473. The first conducting portions 471 are formed by removing portions of the first wiring section 21A by etching, for example. Each of the first conducting portion 471 is connected to the first wiring section 21A and extends from the first wiring section 21A in the first direction x. The second conducting portions 472 are formed by removing portions of the second wiring section 21B by etching, for example. Each of the second conducting portions 472 is connected to the second wiring section 21B and extends from the second wiring section 21B in the first direction x. The plurality of first conducting portions 471 and the plurality of second conducting portions 472 both are aligned like comb teeth in the second direction y.

As shown in FIG. 22, each first conducting portion 471 and a corresponding one or ones of the second conducting portions 472 located adjacent to that first conducting portion 471 are spaced apart from each other. In the semiconductor device A50, each of the first conducting portions 471 and the above-described one or ones of the second conducting portions 472 are spaced apart from each other in the second direction y.

As shown in FIG. 22, the insulating portion 473 includes portions each of which is sandwiched between one of the first conducting portions 471 and the second conducting portion 472 located adjacent to the first conducting portion 471. The insulating portion 473 is thermally conductive. The insulating portion 473 is a ceramic material containing silicon nitride or aluminum nitride, for example. Thus, the insulating portion 473 has a relatively high thermal conductivity. The insulating portion 473 forms a dielectric layer of the snubber capacitor 47.

Figure 23:
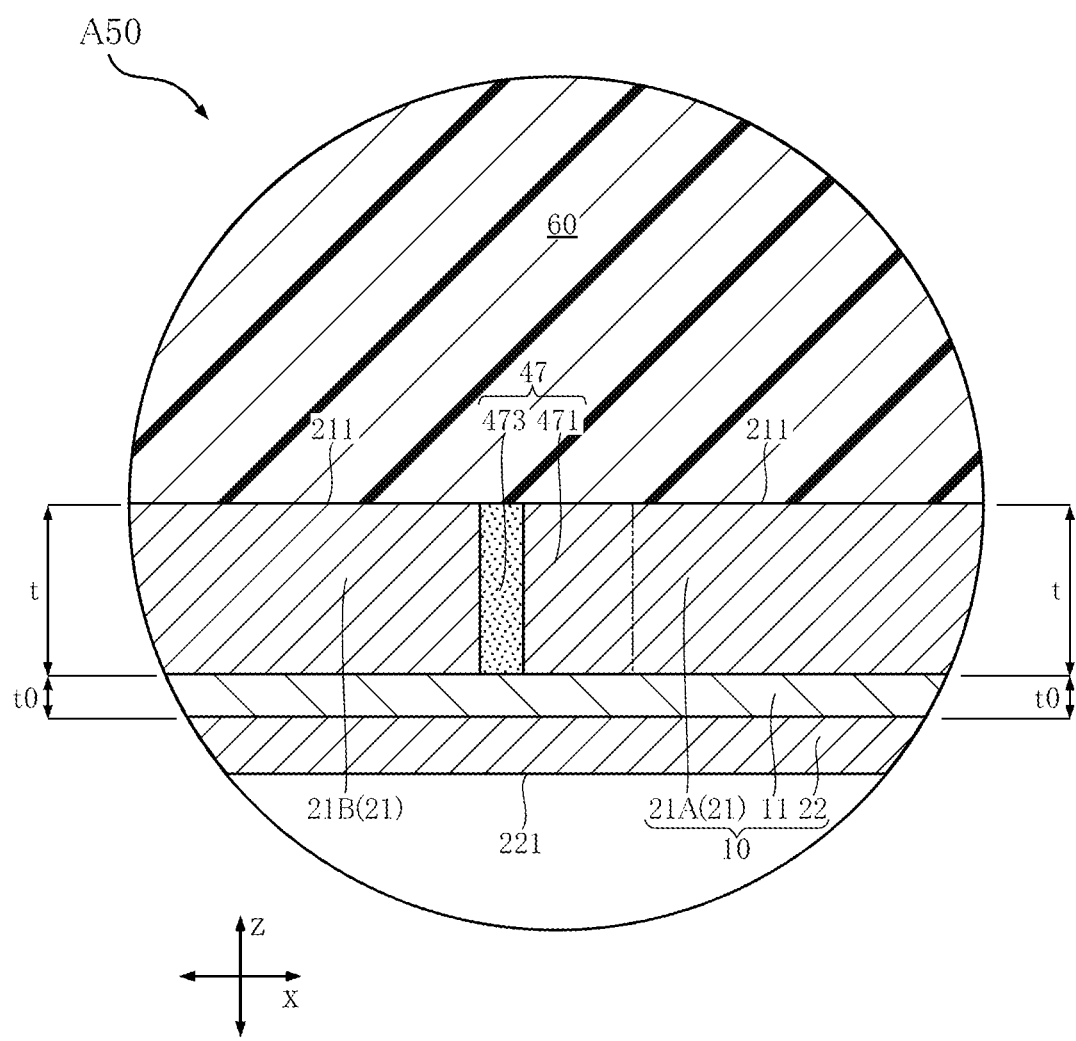
FIG. 23 is a sectional view taken along line XXIII-XXIII in FIG. 22.

As shown in FIG. 23, the insulating portion 473 is in contact with the insulating substrate 11. The snubber capacitor 47 is covered with the sealing resin 60.

Figure 24:
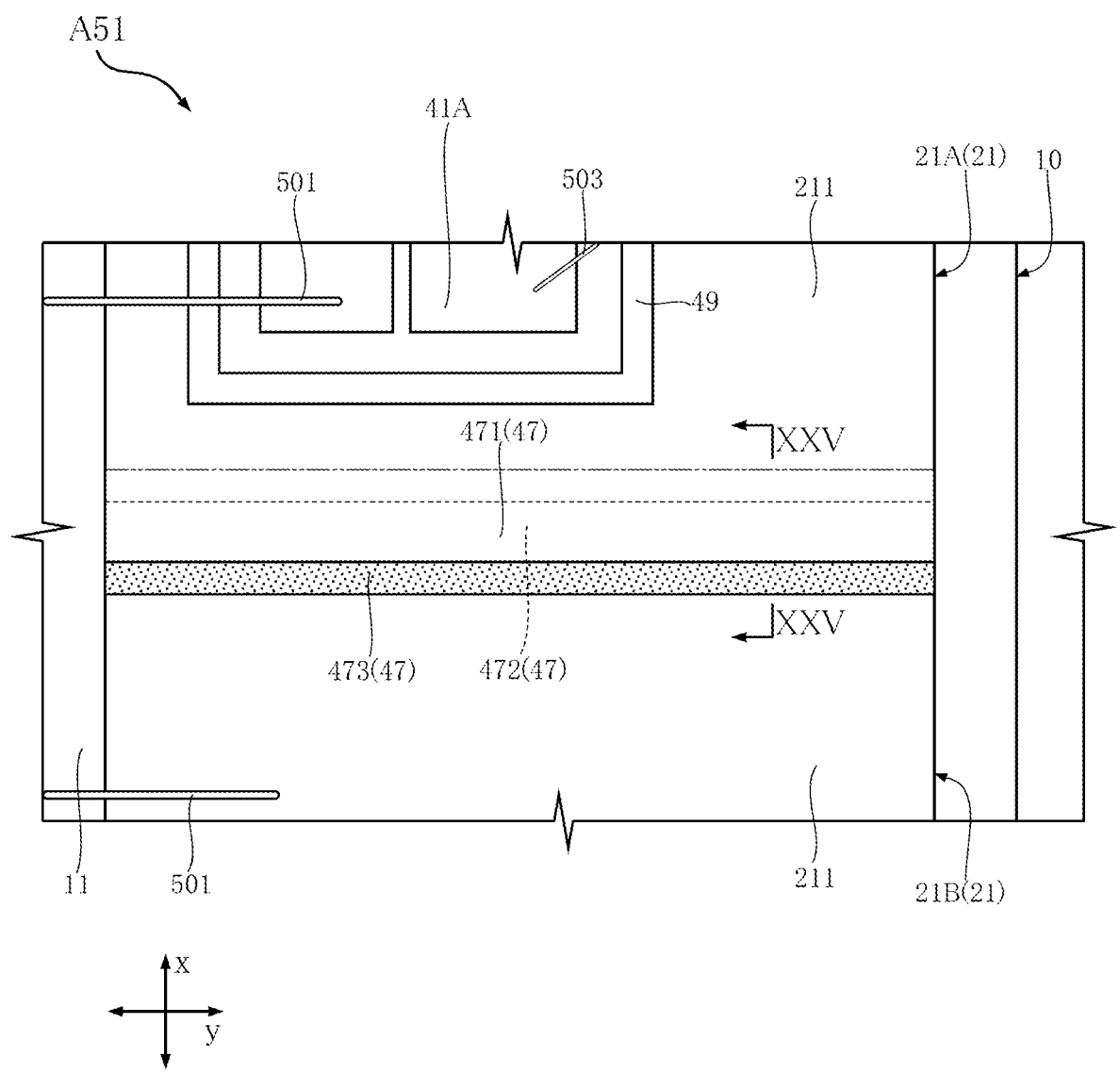
FIG. 24 is a partial enlarged plan view of a semiconductor device according to a variation of the fifth embodiment (as seen through the sealing resin)
Figure 25:
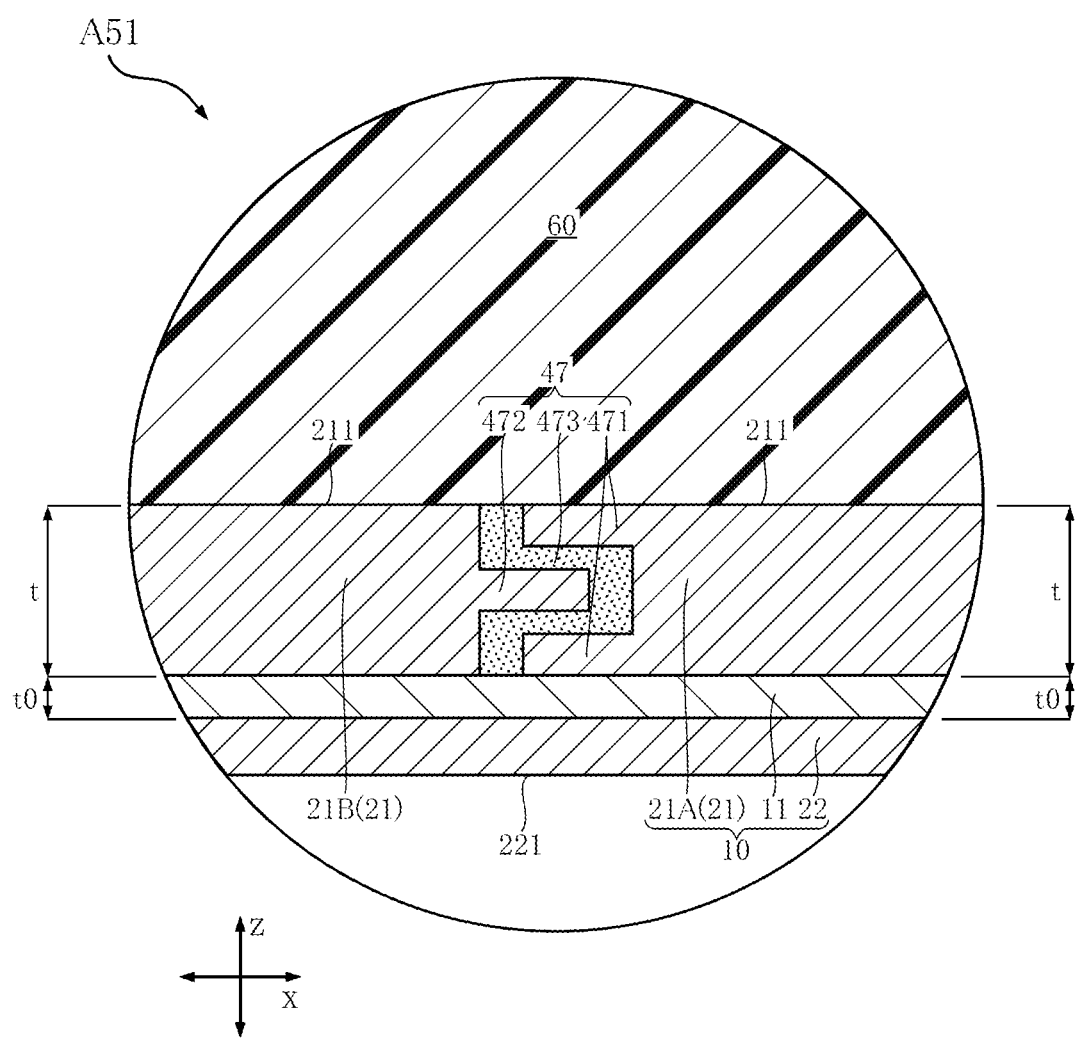
FIG. 25 is a sectional view taken along line XXV-XXV in FIG. 24.

A semiconductor device A51 according to a variation of the fifth embodiment is described with reference to FIGS. 24 and 25. In these figures, the elements that are identical or similar to those of the semiconductor device A10 are denoted by the same reference signs, and the description is omitted. In FIG. 24, the sealing resin 60 is illustrated as transparent.

The semiconductor device A51 differs from the semiconductor device A50 in configuration of the snubber capacitor 47.

As shown in FIG. 24, the snubber capacitor 47 includes a pair of first conducting portions 471, a second conducting portion 472, and an insulating portion 473. Of these, the insulating portion 473 has the same configuration as the insulating portion 473 of the semiconductor device A50 and hence is not described here. The paired first conducting portions 471 and the second conducting portion 472 are both in the form of a strip extending in the second direction y. As shown in FIG. 25, each of the paired first conducting portions 471 is spaced apart from the second conducting portion 472, located adjacent to the first conducting portion 471 in the thickness direction z.

The advantages of the semiconductor device A50 are described below.

The semiconductor device A50 includes a support member 10 that includes a plurality of wiring parts 21 including the first wiring section 21A and the second wiring section 21B spaced apart from each other in the first direction x, and the snubber capacitor 47 located between the first wiring section 21A and the second wiring section 21B. The snubber capacitor 47 has the first conducting portions 471 connected to the first wiring section 21A, the second conducting portions 472 connected to the second wiring section 21B, and the insulating portion 473 including portions sandwiched between the first conducting portions 471 and the second conducting portions 472. In this way, the snubber capacitor 47 forms a snubber circuit for the semiconductor device A50. Thus, the surge voltage generated in the semiconductor device A50 by driving the first switching element 41A and the second switching element 41B is reduced. Moreover, this arrangement eliminates the need for forming a snubber circuit for connection to the semiconductor device A50 on a circuit board to which the semiconductor device A50 is mounted. Thus, an increase in size of the circuit board is avoided. In this way, the semiconductor device A50 allows for avoiding an increase in size of a circuit board on which the device is mounted while reducing the surge voltage generated in the device. Note that the configuration of the snubber capacitor 47 is selectable between the configuration in the semiconductor device A50 and that in the semiconductor device A51.

The first conducting portions 471 of the snubber capacitor 47 are formed of portions of the first wiring section 21A. Also, the second conducting portions 472 of the snubber capacitor 47 are formed of a portion of the second wiring section 21B. Thus, the snubber capacitor 47 has a relatively high heat dissipation capability. Moreover, since the insulating portion 473 of the snubber capacitor 47 is thermally conductive and in contact with the insulating substrate 11, the heat dissipation capability of the snubber capacitor 47 is further enhanced.

The present disclosure is not limited to the foregoing embodiments. The specific configuration of each part described above may be changed in design in many ways.

DESCRIPTION OF THE REFERENCE SIGNS

A10, A20, A30, A40, A50, A51: semiconductor device
10: support member
11: insulating substrate
21: wiring parts
21A: first wiring section
21B: second wiring section
21C: third wiring section
21D: fourth wiring section
211: obverse surface
22: heat dissipator
221: reverse surface
31: input terminal
31A: first input terminal
31B: second input terminal
311: pad portion
312: terminal portion
312A: base part
312B: standing part
32: output terminal
32A: first output terminal
32B: second output terminal
321: pad portion
322: terminal portion
322A: base part
322B: standing part
33: gate terminal
331: pad portion
332: terminal portion
332A: base part
332B: standing part
34: detection terminal
341: pad portion
342: terminal portion
342A: base part
342B: standing part
41A: first switching element
41B: second switching element
411: obverse surface electrode
412: reverse surface electrode
413: gate electrode
42A: first diode
42B: second diode
421: anode electrode
422: cathode electrode
43: first passive element
431: first electrode
432: second electrode
44: second passive element
441: third electrode
442: fourth electrode
45: electrical conductor
46: electrical insulator
461: insulating body
462: adhesive layer
47: snubber capacitor
471: first conducting portion
472: second conducting portion
473: insulating portion
49: bonding layer
501: wire
502: gate wire
503: detection wire
51A: first conduction member
51B: second conduction member
51C: third conduction member
51D: fourth conduction member
60: sealing resin
61: top surface
62: bottom surface
63A: first side surface
63B: second side surface
64: mounting hole
t0, t: thickness
E: DC power supply
z: thickness direction
x: first direction
y: second direction

The invention claimed is:

1. A semiconductor device comprising:
a support member provided with a plurality of wiring parts including a first wiring section and a second wiring section spaced apart from each other in a first direction perpendicular to a thickness direction;
a first switching element electrically connected to the first wiring section;
a second switching element electrically connected to the first switching element and the second wiring section;
a first passive element having a first electrode and a second electrode, the first electrode being bonded to the first wiring section;
a second passive element having a third electrode and a fourth electrode, the fourth electrode being bonded to the second wiring section; and
an electrical conductor connecting the second electrode and the third electrode,
wherein at least one of the first passive element and the second passive element is a capacitor, and
a Young's modulus of the electrical conductor is smaller than that of the first wiring section and that of the second wiring section.

2. The semiconductor device according to claim 1, wherein both the first passive element and the second passive element are capacitors.

3. The semiconductor device according to claim 1, wherein either the first passive element or the second passive element is a resistor.

4. The semiconductor device according to claim 2, wherein the first electrode and the second electrode are spaced apart from each other in the thickness direction,
the third electrode and the fourth electrode are spaced apart from each other in the thickness direction, and
the first passive element and the second passive element are spaced apart from each other in the first direction.

5. The semiconductor device according to claim 4, wherein the electrical conductor is spaced apart from the plurality of wiring parts in the thickness direction and supported by the first passive element and the second passive element.

6. The semiconductor device according to claim 2, wherein the first electrode and the second electrode are spaced apart from each other in the first direction,
the third electrode and the fourth electrode are spaced apart from each other in the first direction, and
the electrical conductor, the second electrode, and the third electrode are located between the first wiring section and the second wiring section as viewed along the thickness direction.

7. The semiconductor device according to claim 5, further comprising an electrical insulator that is thermally conductive and located between the first passive element and the second passive element,
 wherein the electrical insulator is in contact with the electrical conductor and at least one of the first wiring section and the second wiring section.

8. The semiconductor device according to claim 1, further comprising an electrical insulator that is thermally conductive and located between the first wiring section and the second wiring section,
 wherein the electrical insulator is in contact with the electrical conductor and at least one of the first wiring section and the second wiring section.

9. The semiconductor device according to claim 7, wherein the support member includes an insulating substrate to which the plurality of wiring parts are fixed, and
 the electrical insulator is in contact with the insulating substrate.

10. The semiconductor device according to claim 9, further comprising a sealing resin, wherein
 the sealing resin covers the insulating substrate, the plurality of wiring parts, the first switching element, the second switching element, the first passive element, the second passive element and the electrical conductor,
 the support member is located opposite to the plurality of wiring parts with respect to the insulating substrate in the thickness direction, the support member including a heat dissipator fixed to the insulating substrate,
 the heat dissipator is exposed from the sealing resin, and as viewed along the thickness direction, the heat dissipator overlaps with the plurality of wiring parts and located inward of a peripheral edge of the insulating substrate.

11. The semiconductor device according to claim 1, wherein the plurality of wiring parts include a third wiring section,
 the third wiring section is spaced apart from the first wiring section and the second wiring section in a second direction perpendicular to the thickness direction and the first direction,
 the second switching element is bonded to the third wiring section, and
 the first switching element is bonded to the first wiring section and electrically connected to the third wiring section.

12. The semiconductor device according to claim 1, further comprising a first diode and a second diode, wherein
 the first diode is connected in parallel with the first switching element to the first wiring section, and
 the second diode is connected in parallel with the second switching element to the second wiring section.

13. A semiconductor device comprising:
 a support member that includes a plurality of wiring parts including a first wiring section and a second wiring section spaced apart from each other in a first direction perpendicular to a thickness direction;
 a first switching element electrically connected to the first wiring section;
 a second switching element electrically connected to the first switching element and the second wiring section; and
 a snubber capacitor located between the first wiring section and the second wiring section,
 wherein the snubber capacitor has a first conducting portion and a second conducting portion spaced apart from each other, and an insulating portion including a portion sandwiched between the first conducting portion and the second conducting portion,
 the first conducting portion is connected to the first wiring section and extends from the first wiring section in the first direction, and
 the second conducting portion is connected to the second wiring section and extends from the second wiring section in the first direction.

14. The semiconductor device according to claim 13, wherein the support member includes an insulating substrate to which the plurality of wiring parts are fixed, and
 the insulating portion is thermally conductive and in contact with the insulating substrate.

15. The semiconductor device according to claim 14, wherein the first conducting portion and the second conducting portion are spaced apart from each other in a second direction perpendicular to the thickness direction and the first direction.

16. The semiconductor device according to claim 14, wherein the first conducting portion and the second conducting portion are spaced apart from each other in the thickness direction.

17. The semiconductor device according to claim 14, further comprising a sealing resin, wherein
 the sealing resin covers the insulating substrate, the plurality of wiring parts, the first switching element, the second switching element and the snubber capacitor,
 the support member is located opposite to the plurality of wiring parts the with respect to the insulating substrate in the thickness direction, the support member including a heat dissipator fixed to the insulating substrate,
 the heat dissipator is exposed from the sealing resin, and as viewed along the thickness direction, the heat dissipator overlaps with the plurality of wiring parts and located inward of a peripheral edge of the insulating substrate.

\* \* \* \* \*